United States Patent
Stebnicki et al.

(10) Patent No.: US 8,738,332 B2
(45) Date of Patent: May 27, 2014

(54) SYSTEM AND PROCESS FOR CLIENT DRIVEN AUTOMATED CIRCUITING AND BRANCH CIRCUIT WIRING

(76) Inventors: Gerry Stebnicki, Clagary (CA); Terry Smith, Edmonton (CA); Dean Whitford, Spruce Grove (CA); Richard Hatfield, Edmonton (CA)

(*) Notice: Subject to any disclaimer, the term of this patent is extended or adjusted under 35 U.S.C. 154(b) by 993 days.

(21) Appl. No.: 12/626,612

(22) Filed: Nov. 25, 2009

(65) Prior Publication Data

US 2011/0126165 A1     May 26, 2011

(51) Int. Cl.
    *G06F 17/50*     (2006.01)
    *G06G 7/54*     (2006.01)

(52) U.S. Cl.
    USPC ................................. 703/1; 703/18; 716/119

(58) Field of Classification Search
    USPC ............ 703/1, 2, 18; 716/109, 119, 126, 133
    See application file for complete search history.

(56) References Cited

U.S. PATENT DOCUMENTS

| | | | |
|---|---|---|---|
| 8,150,660 B2 * | 4/2012 | Reghetti et al. | 703/1 |
| 2006/0072271 A1 * | 4/2006 | Jones et al. | 361/93.1 |

* cited by examiner

*Primary Examiner* — Kamini S Shah
*Assistant Examiner* — Andre Pierre Louis

(57) ABSTRACT

A computer aided design application modifies a CAD drawing having one or more electrical components by optimizing a plurality of circuits and associated panels, and assigning circuit and panel identifiers to each component for producing an engineering drawing. Further such identified components can be placed in home run groups, implementing shortest path calculations for various wire types and using neutral wires sharing options for producing an engineering drawing illustrating the home run grouping and identifiers, panel schedules and complete bills of materials.

31 Claims, 43 Drawing Sheets

| DESIGNATION  C | | | | | | | | | | JOB # EldrigeDesign200905 | |
|---|---|---|---|---|---|---|---|---|---|---|---|

OF CIRCUITS  60           LOCATION  Room: 192 ELECTRICAL     PROJECT _____
120/208  VOLTS                         Floor: 1
INTERRUPTING CAPACITY 5   kAIC

| SERVICE DESCRIPTION | DEVICE COUNT | WATTS | A | P | CCT. # | A B C | CCT. # | P | A | WATTS | DEVICE COUNT | SERVICE DESCRIPTION |
|---|---|---|---|---|---|---|---|---|---|---|---|---|
| R: 105 CLASSROOM 106 ELEC-+ | | 940 | 15 | 1 | 1 | | 2 | 1 | 15 | 1200 | | R: 102 CORRIDOR |
| R: 103 CLASSROOM | | 900 | 15 | 1 | 3 | | 4 | 1 | 15 | 1200 | | R: 102 CORRIDOR |
| R: 104 BREAKOUT | | 800 | 15 | 1 | 5 | | 6 | 1 | 15 | 1200 | | R: 102 CORRIDOR |
| R: 106 CLASSROOM 107 CLAS-+ | | 1000 | 15 | 1 | 7 | | 8 | 1 | 15 | 1200 | | R: 102 CORRIDOR |
| R: 108 CLASSROOM 110 CLAS-+ | | 900 | 15 | 1 | 9 | | 10 | 1 | 15 | 720 | | R: 102 CORRIDOR 133 JANIT-+ |
| R: 111 CLASSROOM 113 VEST-+ | | 1100 | 15 | 1 | 11 | | 12 | 1 | 15 | 1200 | | R: 135 LIBRARY 136 AUDIO/-+ |
| R: 192 ELECTRICAL 191 STO-+ | | 600 | 15 | 1 | 13 | | 14 | 1 | 15 | 1200 | | R: 136 AUDIO/VISUAL |
| R: 128 STAFF WORKROOM | | 1200 | 15 | 1 | 15 | | 16 | 1 | 15 | 1200 | | R: 137 BOYS WASHROOM |
| R: 128 STAFF WORKROOM | | 1000 | 15 | 1 | 17 | | 18 | 1 | 15 | 1000 | | R: 135 LIBRARY |
| R: 128 STAFF WORKROOM | | 1200 | 15 | 1 | 19 | | 20 | 1 | 15 | 800 | | R: 135 LIBRARY |
| R: 129 KITCHEN 128 STAFF -+ | | 800 | 15 | 1 | 21 | | 22 | 1 | 15 | 1200 | | R: 134 GIRLS WASHROOM |
| R: 129 KITCHEN | | 1200 | 15 | 1 | 23 | | 24 | 1 | 15 | 1200 | | R: 129 KITCHEN |
| R: 129 KITCHEN | | 1200 | 15 | 1 | 25 | | 26 | 1 | 15 | 500 | | R: 129 KITCHEN |
| R: 129 KITCHEN | | 1200 | 15 | 1 | 27 | | 28 | 1 | 15 | 1200 | | R: 129 KITCHEN |
| R: 129 KITCHEN | | 1200 | 15 | 1 | 29 | | 30 | 1 | 15 | 1200 | | R: 129 KITCHEN |
| Spare Breaker | | | | | 31 | | 32 | | | | | Spare Breaker |
| Spare Breaker | | | | | 33 | | 34 | | | | | Spare Breaker |
| Spare Breaker | | | | | 35 | | 36 | | | | | Spare Breaker |
| Space | | | | | 37 | | 38 | | | | | Space |
| Space | | | | | 39 | | 40 | | | | | Space |
| Space | | | | | 41 | | 42 | | | | | Space |
| Space | | | | | 43 | | 44 | | | | | Space |
| Space | | | | | 45 | | 46 | | | | | Space |
| Space | | | | | 47 | | 48 | | | | | Space |
| Space | | | | | 49 | | 50 | | | | | Space |
| Space | | | | | 51 | | 52 | | | | | Space |
| Space | | | | | 53 | | 54 | | | | | Space |
| Space | | | | | 55 | | 56 | | | | | Space |
| Space | | | | | 57 | | 58 | | | | | Space |
| Space | | | | | 59 | | 60 | | | | | Space |

| CONN. LOADS | LIGHTING → 0 | | CONN. LOADS | LIGHTING → 0 | |
|---|---|---|---|---|---|
| | RECEP. → 15240 | | | RECEP. → 16220 | |

PHASE LOADS → A: 9840 w       B: 10520 w      C: 11100 w

WATTAGE LOADS BY SYSTEM:

LIGHTING →  0 w x 100% = 0 w         HEATING →  0 w x 100% = 0 w

RECEP. → 31460 w x 75% = 23595 w     PANEL/TRANSFORMER  0 w x 100% = 0 w

MOTORS → 0 w x 75% = 0 w             OTHER → 0 w x 100% = 0 w

EXIST/FUTURE →           = W

TOTAL WATTAGE BEFORE DERATED SUITES       TOTAL ACTUAL AMPERES LOAD
→ 23595 w x 100% = 23595 w                                    → 66 A
  Calculated   Load    Panel Load
  Demand       Adjust  Before Suites    BUS SIZE       →  225 A DERATED SUITES →                0 w    FEEDER →
                                          1 1/4"C-4#3 XL
TOTAL WATTAGE LOAD WITH DERATED SUITES
→                       23595 w        BREAKER / FUSE → 3P — 100A

*Fig. 9*

BRANCH CIRCUIT PANEL SCHEDULE

DESIGNATION __E__  JOB # __EldrigeDesign200905__

OF CIRCUITS __42__  LOCATION __Room: 123 MECHANICAL__  PROJECT __RiverFront School__
__277/480__ VOLTS  Floor: __1__
INTERRUPTING CAPACITY __16__ kAIC

| SERVICE DESCRIPTION | DEVICE COUNT | WATTS | A | P | CCT. # | A | B | C | CCT. # | P | A | WATTS | DEVICE COUNT | SERVICE DESCRIPTION |
|---|---|---|---|---|---|---|---|---|---|---|---|---|---|---|
| L: 105 CLASSROOM 103 CLAS-+ | | 2275 | 15 | 1 | 1 | | | | 2 | 1 | 15 | 2485 | | L: 133 JANITOR 137 BOYS W-+ |
| L: 108 CLASSROOM 107 CLAS-+ | | 2835 | 15 | 1 | 3 | | | | 4 | 1 | 15 | 2030 | | L: 129 KITCHEN 111 CLASSR-+ |
| L: 102 CORRIDOR | | 630 | 15 | 1 | 5 | | | | 6 | 1 | 15 | 773 | | L: 118 MENS 119 WOMENS+ |
| L: 101 FOYER | | 2700 | 15 | 1 | 7 | | | | 8 | 1 | 15 | 2935 | | L: 171 OFFICE 172 OFFICE+ |
| L: 101 FOYER | | 1800 | 15 | 1 | 9 | | | | 10 | 1 | 15 | 2940 | | L: 167 CORRIDOR 165 CLASS-+ |
| L: 101 FOYER | | 1800 | 15 | 1 | 11 | | | | 12 | 1 | 15 | 2450 | | L: 167 CORRIDOR 156 CLASS-+ |
| L: 139 GYMNASIUM | | 2100 | 15 | 1 | 13 | | | | 14 | 1 | 15 | 2310 | | L: 163 CLASSROOM 196 CLAS-+ |
| L: 139 GYMNASIUM | | 1800 | 15 | 1 | 15 | | | | 16 | 1 | 15 | 2415 | | L: 167 CORRIDOR 197 CLASS-+ |
| L: 139 GYMNASIUM | | 1800 | 15 | 1 | 17 | | | | 18 | | | | | Spare Breaker |
| Spare Breaker | | | | | 19 | | | | 20 | | | | | Spare Breaker |
| Spare Breaker | | | | | 21 | | | | 22 | | | | | Spare Breaker |
| Spare Breaker | | | | | 23 | | | | 24 | | | | | Space |
| Space | | | | | 25 | | | | 26 | | | | | Space |
| Space | | | | | 27 | | | | 28 | | | | | Space |
| Space | | | | | 29 | | | | 30 | | | | | Space |
| Space | | | | | 31 | | | | 32 | | | | | Space |
| Space | | | | | 33 | | | | 34 | | | | | Space |
| Space | | | | | 35 | | | | 36 | | | | | Space |
| Space | | | | | 37 | | | | 38 | | | | | Space |
| Space | | | | | 39 | | | | 40 | | | | | Space |
| Space | | | | | 41 | | | | 42 | | | | | Space |

CONN. LOADS  LIGHTING → 17740  RECEP. → 0
CONN. LOADS  LIGHTING → 18338  RECEP. → 0

PHASE LOADS → A: __14805__ W  B: __13820__ W  C: __7453__ W

WATTAGE LOADS BY SYSTEM:
LIGHTING → __36078__ W × __100%__ = __36078__ W
RECEP. → __0__ W × __75%__ = __0__ W
MOTORS → __0__ W × __75%__ = __0__ W

HEATING → __0__ W × __100%__ = __0__ W
PANEL / TRANSFORMER → __0__ W × __100%__ = __0__ W
OTHER → __0__ W × __100%__ = __0__ W
EXIST / FUTURE → = __ __ W

TOTAL WATTAGE BEFORE DERATED SUITES
→ __36078__ W × __100%__ = __36078__ W
Calculated Demand  Load Adjust  Panel Load Before Suites

DERATED SUITES __0__ W

TOTAL WATTAGE LOAD WITH DERATED SUITES → __36078__ W

TOTAL ACTUAL AMPERES LOAD → __44__ A
BUS SIZE → __225__ A
FEEDER → __1 1/4"C-4#3 XL__
BREAKER / FUSE → __3P - 100A__

CONDUIT & WIRING

| Item | Units | Qty |
|---|---|---|
| .75" Conduit | Meters | 436.45 |
| 0.75" Conduit | Meters | 3379.05 |
| 1" Conduit | Meters | 177.63 |
| 1.25" Conduit | Meters | 54.04 |
| 2" Conduit | Meters | 42.86 |
| 2.50" Conduit | Meters | 92.66 |
| 3.50" Conduit | Meters | 6.23 |
| #10 CU Wire | Meters | 2395.58 |
| #12 CU Wire | Meters | 9330.14 |
| #2 CU Wire | Meters | 221.03 |
| #3/0 CU Wire | Meters | 163.66 |
| #4 CU Wire | Meters | 640.96 |
| #4/0 CU Wire | Meters | 9.58 |
| #6 CU Wire | Meters | 809.38 |
| #8 CU Wire | Meters | 394.65 |
| 300MCM CU Wire | Meters | 375.59 |
| 750MCM CU Wire | Meters | 20.52 |
| 2 Wire AC #10 | Meters | 442.78 |
| 2 Wire AC #12 | Meters | 156.52 |

Total Breakers

98x1P–15A 10 kaic, 1x1P–15A 14 kaic, 17x1P–15A 25 kaic
1x2P–50A 10 kaic, 6x3P–50A 25 kaic, 1x3P–100A 10 kaic
1x3P–100A 18 kaic, 3x3P–100A 25 kaic, 1x3P–125A 10 kaic
1x3P–125A 18 kaic, 1x3P–175A 25 kaic, 1x3P–350A 25 kaic
1x3P–600A 25 kaic

TOTAL PANELS AND TRANSFORMERS

| Type | Size | Configuration | Qty |
|---|---|---|---|
| MDP | 42 | Main Distribution Panel | 1 |
| CDP | 12 | Central Distribution Panel | 1 |
| CDP | 24 | Central Distribution Panel | 2 |
| MCC | 24 | Motor Control Center | 1 |
| Regular | 60 | Surface/Single Tub | 1 |
| Regular | 42 | Surface/Single Tub | 1 |
| Regular | 60 | Surface/Single Tub | 2 |
| Emergency | 18 | Surface/Single Tub | 2 |
| Transformer | 225.0 | 3P 480V 3W : 3P 120/208V 4W | 1 |

SYSTEM MATERIALS

| Item | Units | Qty |
|---|---|---|
| 1 Gang Switch | each | 87 |
| 3 Gang Switch | each | 4 |
| Duplex Receptacle | each | 345 |
| GFI Receptacle – Above Counter | each | 10 |
| Kitchen Duplex Receptacle | each | 3 |
| Special Receptacle | each | 1 |
| Motor | each | 6 |
| Junction Box (Direct Load) | each | 1 |
| Junction Box (No Load) | each | 144 |
| Kitchen Junction Box (Direct Load) | each | 2 |
| Key Pad | each | 2 |
| Wall Clock | each | 7 |
| Wall Combination Data/Tel | each | 35 |
| Wall Data | each | 21 |
| Wall Motion Sensor | each | 10 |
| Wall PA | each | 7 |
| Fire Alarm Control Panel | each | 1 |
| Fire Alarm Pullstation | each | 17 |
| Fire Alarm Speaker c/w Strobe | each | 9 |

*Fig. 27*

PANELS AND TRANSFORMERS

PANELS

| Name / Breakers | Type | Size | Voltage | Wires | Phase | IC | Configuration |
|---|---|---|---|---|---|---|---|
| MDP | MDP | 42 | 277/480V | 4 | 3 | 20 | Main Distribution Panel |
| 1x3P-100A 25 kaic, 1x3P-175A 25 kaic, 1x3P-350A 25 kaic, 1x3P-600A 25 kaic | | | | | | | |
| CDPa | CDP | 24 | 277/480V | 4 | 3 | 18 | Central Distribution Panel |
| 2x3P-100A 25 kaic | | | | | | | |
| CDPb | CDP | 24 | 120/208V | 4 | 3 | 11 | Central Distribution Panel |
| 1x3P-100A 18 kaic, 1x3P-125A 18 kaic | | | | | | | |
| CDPc | CDP | 12 | 120/208V | 4 | 3 | 5 | Central Distribution Panel |
| 1x3P-100A 10 kaic, 1x3P-125A 10 kaic | | | | | | | |
| MCC | MCC | 24 | 480V | 3 | 3 | 19 | Motor Control Center |
| 6x3P-50A 25 kaic | | | | | | | |
| A | Emergency | 18 | 120/208V | 4 | 3 | 2 | Surface/Single Tub |
| 1x1P-15A 10 kaic | | | | | | | |
| B | Emergency | 18 | 277/480V | 4 | 3 | 3 | Surface/Single Tub |
| 1x1P-15A 14 kaic | | | | | | | |
| C | Regular | 60 | 120/208V | 4 | 3 | 4 | Surface/Single Tub |
| 30x1P-15A 10 kaic | | | | | | | |
| D | Regular | 60 | 120/208V | 4 | 3 | 2 | Surface/Single Tub |
| 29x1P-15A 10 kaic, 1x2P-50A 10 kaic | | | | | | | |
| E | Regular | 42 | 277/480V | 4 | 3 | 16 | Surface/Single Tub |
| 17x1P-15A 25 kaic | | | | | | | |
| G | Regular | 60 | 120/208V | 4 | 3 | 7 | Surface/Single Tub |
| 38x1P-15A 10 kaic | | | | | | | |

TRANSFORMERS

| Name | KVA Total | Pri. Phase | Pri. Wires | Pri. Volt. | Sec. Phase | Sec. Wires | Sec. Volt. |
|---|---|---|---|---|---|---|---|
| T1 | 225.0 | 3 | 3 | 480V | 3 | 4 | 120/208V |

*Fig. 28*

SYSTEM AND PROCESS FOR CLIENT DRIVEN AUTOMATED CIRCUITING AND BRANCH CIRCUIT WIRING

FIELD OF THE INVENTION

The invention relates to a system for receiving a raw computer assisted drawing (CAD), and forming a detailed computer-automated circuiting and branch circuit wiring drawing, the content of which complies with regulatory and client criteria. More particularly, a client supplies a CAD drawing including building electrical systems components and the system adds the necessary panels, assigns circuits for updating the CAD drawing including panel schedules and further can draw branch circuit wiring interconnections between the components.

BACKGROUND OF THE INVENTION

In one context, a building design, in the form of architectural drawings (preliminary drawings), is provided to an engineer or design professional who applies codes, standards and rules to prepare and adjust the building design as necessary to ensure regulatory compliance and to meet the client's individual requirements. During this process, the design professional generates sufficient detail for the production of detailed engineering drawings and specifications suitable for construction including the location and type of electrical services, all of which are subject to regulatory or higher design criteria. The detailed drawings are usually done by a team of skilled draftspersons, who may also be design professionals. These professionals also inject individuality and further detail into the final design.

In Applicant's previous U.S. Pat. No. 6,999,907 assigned to Draftlogic System, Inc., Alberta, Canada, a process is provided for automating the determination of detailed engineering specifications and production of detailed engineering CAD drawings from a client's raw architectural drawings. An architectural drawing comprises a multitude of drawings elements but it also comprises assets formed of such drawings elements including corridors, rooms and utility rooms, all of which have different requirements for electrical and mechanical services, standards and compliance. The architectural drawing, containing an architectural structure, is parsed to locate the structure's determinative assets. Standards applicable to at least the functional characteristics of the assets are applied for generating the detailed features necessary for production of detailed engineered drawings. Further, the client's known professional preferences can be imparted, while still resulting in detailed designs that conforms to the client's personal and professional expectations.

An example of Applicant prior process is the generation of drawings which include: number and capacity of electrical components which are substantially compatible with a raw architectural preliminary layout specifying boundaries or rooms and location of electrical components.

To date electrical circuiting has still required the application of professional skill, application of various rules of thumb and estimating.

Some automation has been attempted in CAD programs such as through manual user interaction, specifically through the manual picking of like and adjacent electrical services on a CAD drawing, which are to be circuited together, the optimal arrangements being performed by the human user. A user selects a circuit and then select the components to put on that circuit. The selected components are tagged with the chosen circuit number a panel schedule is populated with the total load for the circuit. Further, individual clients or draftspersons are expected to distinguish a room from a corridor, and then define which of the various types of rooms receive which level of services (e.g. dedicated electrical outlets) and how the service will be supplied (e.g. through the floor or from the ceiling).

This known process, is laborious and inflexible. It is inevitable that there will be changes in the overall design which arise during the usually protracted duration between obtaining preliminary drawings and final issuance of the detailed drawings. Changes require the human user to repeat the selection steps. Further, the resulting level and quality of the details in the design is variable due to many levels of design input, from the design professional to the draftspersons. There is a need to repeatedly and dynamically revise each drawing, in a domino effect, for changes which arise in one or more related drawings. Revisions can result in a fragmentation of an originally well-ordered circuit structure, with deletions and merely appending of newly revised circuits.

About one half of the time expended, between obtaining preliminary drawings and issuance of the detailed design drawings, is consumed in the detailed drafting portion. This creates two main disadvantages: a significant time delay, and a related increase in cost.

Further, while an architect, design professional or other client is constrained by many known and standardized codes, there are also instances where the known codes are inapplicable and personal judgment is applied or where the client's or design professional's personal standards exceed those of the codes. Each time the design process is commissioned, those personal and professional judgments or standards must be communicated to and be known by the draftsperson, generally through a working relationship developed over time, so that that appropriate standards and codes are utilized. Often the draftsperson simply adopts a number of personal and professional judgments or standards that are known, or which are assumed to be preferred by the design professional and those become the rules which are applied to the detailed design drawings.

Typically, under budget pressures, the actual design process is a combination of personal designer judgment and CAD tools. Accordingly, in a conservative approach to design, and avoid tedious recursive calculations, a designer might overspecify lighting for a particular room, ultimately resulting in too much light for the room's purpose, an initial higher capital cost for fixtures and wiring, perhaps requiring an increase in wire size for the circuit, and a needless increase in energy requirements in operation. In the future, there is more waste in renovation or demolition.

Further, due to the difficulty involved in establishing the actual wiring, considering possible circuit grouping or routing options, it is a common practice in the industry to simply avoid illustrating wiring on the electrical drawing at all and leave the actual routing of wiring to the field installers. Simply, there are a large number of manhours expended in the mere drawing of branch circuit wiring especially when following the more stringent routing rules for conduit and wire compared to the more relaxed rules for drawing armored cable.

Accordingly, there is identified a need for a system to aid the design professional, clients and client-engineers who wish to improve the detailed design process for the production of electrical engineering drawings including to achieve the following: reduced turnaround, reduced costs, repeatedly and reliably applied personalized standards, and reduced overhead on the design professional where professional and standard codes are known and where individual professional standards can be learned and applied.

SUMMARY OF THE INVENTION

The present invention is a process for automated electrical circuiting, branch circuit wiring and production of detailed engineering CAD drawings from a client's architectural drawings. Architectural drawings are not generally sufficiently detailed for one to develop a cost estimate, to direct the actions of a construction contractor, nor to establish compliance with electrical standards, to name a few. Not only does an architectural drawing comprises a multitude of drawings elements but it also comprises assets formed of such drawings elements including corridors, rooms and utility rooms, all of which have different requirements for electrical and mechanical services, standards and compliance. Herein, application of the automated electrical circuiting or branch circuit wiring, or both can result in reductions in significant reductions in design time, design cost, optimization of electrical circuit grouping and routing and minimization of material use with the resulting savings associated therewith. Further, the system and process can prepare electrical engineering drawings and schedules where, in many instances, none would be prepared at all due the overwhelming options and cost for completing a comprehensive branch circuit wiring.

In an embodiment of the invention, a process of automated circuiting for electrical services is provided for determining and creating electrical drawings from architectural CAD drawings. The CAD drawings comprise architectural assets such as room having geometrical characteristics such as a bounded area, and having functional characteristics like a school classroom or gymnasium. The rooms have electrical components such as receptacles, lighting and electrically-driven or actuated mechanical equipment. The automated circuiting comprises identifying rooms and the electrical components therein and assigning the components to one or more circuits which are terminated at one or more electrical panels. Each electrical device is associated with electrical parameters which define its type and characteristics including electrical load. Like electrical components are typically assigned to a like circuit, such as all receptacles on one circuit, lighting on another circuit.

Like electrical components, within a room, are added to a circuit. The number of components per circuit are based upon one or more parameters including specified proximity, routing, user and code requirements. If, after adding all like components from a room, and there is remaining capacity in the circuit, one can repeat the adding of electrical components from neighboring, compatible rooms. Once there are no more compatible components or once one of a determined limit is reached such as a maximum specified load, the circuit is closed. The process repeats until all electrical components, for each type of electrical component, are located on one or more circuits. Each closed circuit is assigned a circuit identifier and a further assigned an electrical panel identifier. At this point, generation of a branch circuit panel schedule is possible listing each circuit, a service description of the room or rooms, and the number of components thereon.

In further embodiments of the invention, the components are added to each circuit in an ordered arrangement, for example receptacles about a room are added sequentially as they are arranged about a room's periphery, or lighting in a row/column format. In another embodiment, the number of components added to a circuit are added up to a specified maximum electrical capacity such as a specified wattage.

In other embodiments a circuit can add components from a qualifying neighboring room, qualification being defined by criteria such as, where all of the like components in that neighboring room can be accommodated in the remaining space on the circuit and that neighboring room is serviced by the same electrical room.

In a further embodiment, each circuit is terminated at a panel which can be specified by the user or selected and specified by the system. The characteristics of the type of electrical components on each closed circuit can dictate which panel is used, such as single phase or three-phase, or where phase is not indicated, based on wire count. Electrical components that are single phase can be circuited to either single phase or three phase panel of matching voltage. Components that are three phase are circuited to a three phase panel of matching voltage. One factor for efficient circuiting comprises identifying circuits terminated at different phases of same panel so as to promote neutral sharing, and circuits terminating at the same side of panel to ease installation. Further, same types of electrical components are grouped in adjacent panel slots.

Once circuits are identified, using one or more of the embodiments of the automated circuiting discussed above, or using some manual circuit assignment or combination thereof, there is further provided a process for automated branch circuit wiring.

In embodiments of the invention, wiring and corresponding CAD lines can be determined and applied to the CAD drawing for connecting assigned components of each identified circuit to its respective assigned panel. Further embodiments include grouping two or more circuits together for home runs to the panel, typically circuits including a shared neutral. Wire counts can be calculated and accommodations made for the affects of voltage drop. For example, in other embodiment's, routing can be determined and distance calculations enable confirmation or determination of wire sizes based upon parameters including circuit loading and voltage drop.

Automated branch circuit wiring comprises assigning each circuit to a home run group, such as to share conduit and a common neutral when feasible. A shortest path is determined to interconnect all of the electrical components within each home run group, the wire sizes are determined, the wire counts are determined, and a component device within each home run group that is closest to the branch circuit panel is designated and labeled as the home run location.

In a broad aspect, engineering drawings are produced from a computer-aided drafting (CAD) drawing having electrical components by implementing a computer aided design application for loading the CAD drawing and assigning circuits and panels identifiers to each component. The CAD drawing has at least one space, such as rooms or corridors having one or more of the electrical components therein. One identifies a service area from the CAD drawing, the service area having at least one electrical component therein. Initially, the application creates two or more unassigned circuits, each unassigned circuit being associated with a compatible type of component of the electrical components, each unassigned circuit begin created by identifying a compatible component in the at least one space, populating the unassigned circuit with the compatible component; determining if the unassigned circuit is finished; and repeating the identifying of a subsequent compatible component and populating the unassigned circuit with the subsequent compatible components until the unassigned circuit is finished, and repeating creating finished, unassigned circuits for each of the two or more unassigned circuits. One determines a shortest route for each finished, unassigned circuit and reorganizes finished, unassigned circuits for gathering finished, unassigned circuits having routes of close proximity. On associates each finished, unassigned circuit with a panel having a unique panel identifier, and the panel for gathered unassigned circuits would be a common panel. One can then establish a completed circuit by assigning, to each finished, unassigned circuit, a circuit identifier and the panel identifier for the panel associated therewith and produce an electrical engineering drawing having each component identified by its panel identifier and circuit identifier.

In another broad aspect of the invention, given a CAD drawing having components identified with circuit and panel identifiers, such as resulting from the above process, or some other manual or automated process, one can further perform branch circuit wiring including identifying one or more of these completed circuits in the selected area and grouping completed circuits into one or more home run groups. For each home run group, one establishes the interconnection relationship of the one or more compatible components on each of the groupable completed circuits, determines a home run location of a compatible component of the home run group closest to the associated compatible panel; and determines a shortest path of the home run group to the home run location. The application then establishes branch circuit line drawing elements according to the established interconnection relationship of the one or more compatible components and along the shortest path and assigns a home run identifier to each home run location for producing an electrical engineering drawing wherein each component is interconnected with the branch circuit line drawing elements and identified by its panel identifier and circuit identifier.

BRIEF DESCRIPTION OF THE DRAWINGS

FIG. 6 is a base drawing of a selected area from the CAD drawing of FIG. 4 from which other more detailed drawings arise, the base drawing divided into four quadrants A, B, C, and D for illustrative purposes, including a plurality of spaces that are ready for auto-circuiting, including the classroom of FIG. 5;

FIG. 9 is an example of a branch circuit panel schedule for panel C according to the auto-circuiting applied in FIG. 8;

FIG. 10 is an example of a branch circuit panel schedule for panel E according to the auto-circuiting applied in FIG. 8;

FIG. 25A is an example of an application dialog for illustrating sample fault level parameters;

FIG. 25B is an example of an application dialog for illustrating sample parameters for one type of panel, in particular for an emergency panel;

Figure 26:
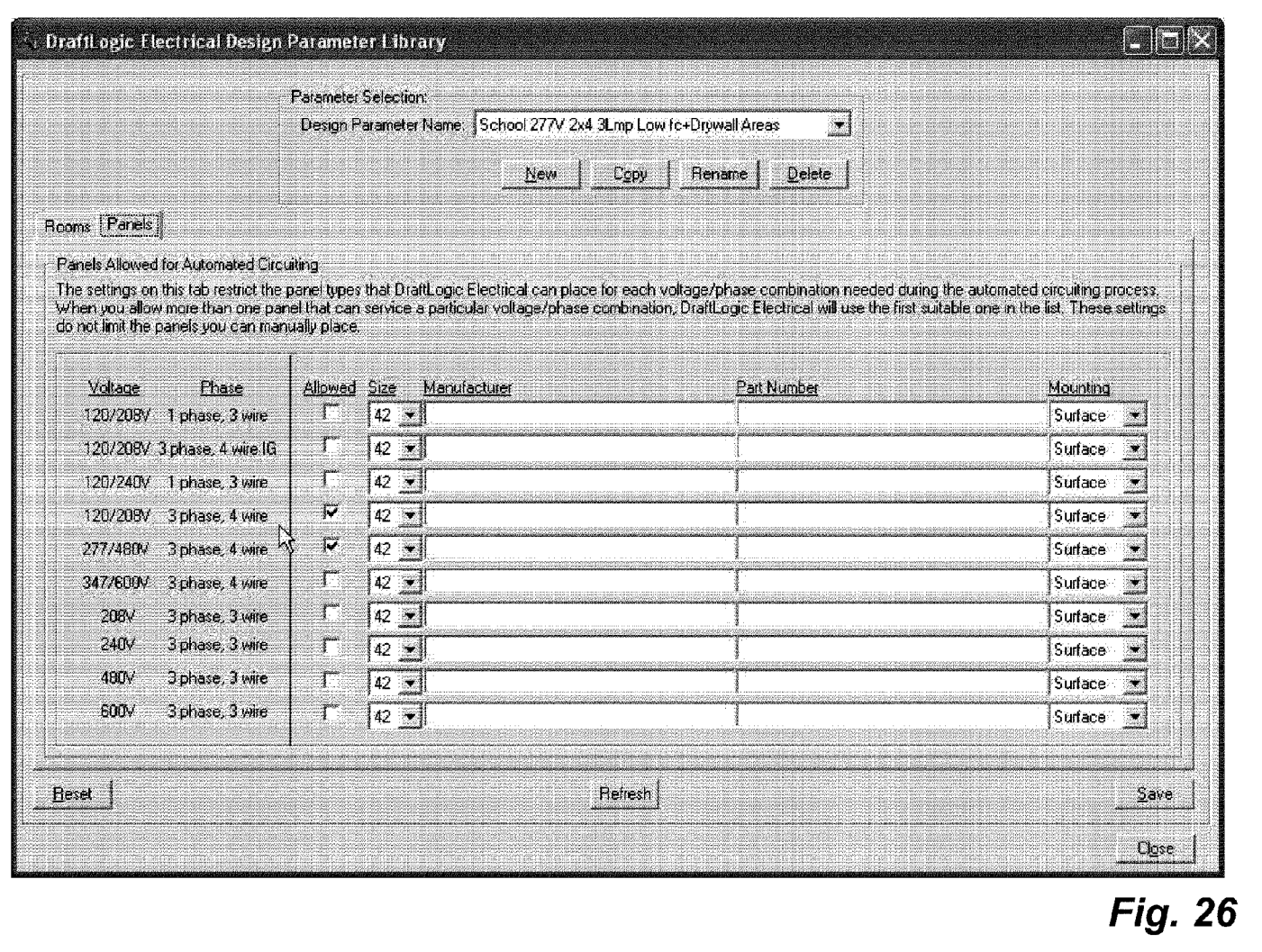

FIG. 26 is an example of an application dialog for illustrating user selection of allowed panels for circuiting;

FIGS. 27 and 28 illustrate bills of materials which are generated as a benefit of an implementation of one embodiment of branch circuit wiring application.

DETAILED DESCRIPTION OF THE INVENTION

The present invention is a design/drafting system for use by design professionals (also known as end users or client/engineers). The system is complementary to existing proprietary computer assisted drawing (CAD) software packages such as AutoCAD, from Autodesk Inc. of San Rafael, Calif., or Microstation from Bentley Systems, Incorporated of Exton, Pa., United States.

A CAD drawing is provided which comprises architectural assets such as rooms having geometrical characteristics such as a bounded area, and typically having functional characteristics like a school classroom or gymnasium. The rooms have electrical components such as receptacles, lighting and electrically-driven or actuated mechanical equipment. While receptacles, lighting and mechanical equipment may have a variety of designations under different regulatory codes, e.g "utilization equipment", herein they are collectively referred to as electrical components or simply components unless expressly stated in their particular form.

In a preferred embodiment, the system accepts end user or client input, including the raw CAD information in a digital format and, coupled with a rule-based process for applying standards and client preferences, and generates detailed electrical engineering specifications and information. This embodiment is described in terms of the evolution from raw CAD drawings, having at least building electrical system components, to completed electrical engineering drawings and branch circuit wiring diagrams including related information such as panel schedules. However, it is understood that the principles described herein can also be applied in other disciplines in which such a process can be applied.

Figure 1:
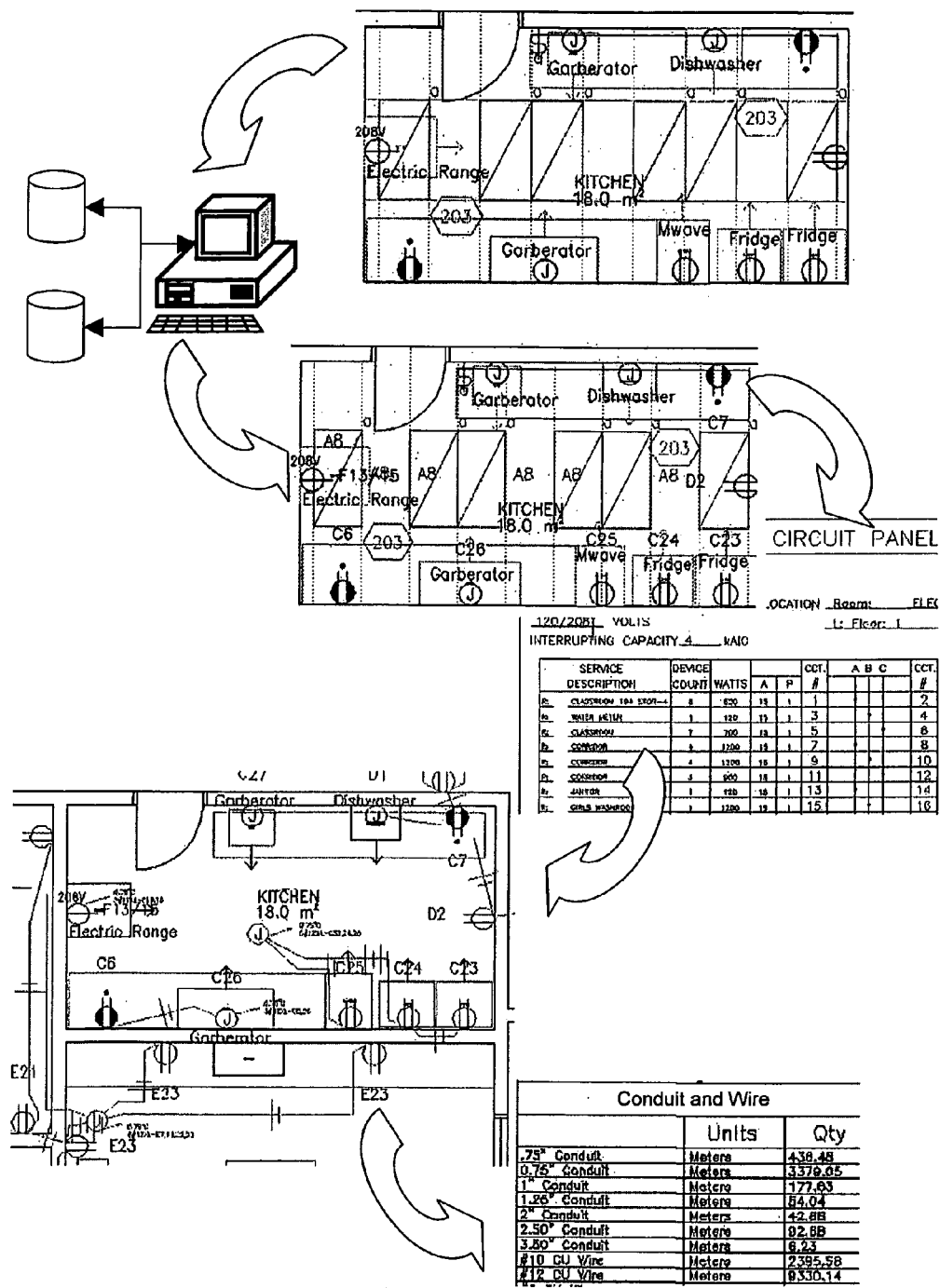
FIG. 1 is an overall schematic representation of embodiments of the automatic circuiting and automatic branch circuit wiring of the present invention.

A computer system implements application software for practicing the method of the invention and comprises a computer processing means including digital input and output means for receiving and writing/transmitting digital drawing information. Further, the client access terminal 10 [20091124DW: what is 'client access terminal 10'?] provides hardware and software processing means capable of interpreting, reading and writing drawing information files, including databases and CAD files. The computer processing means can be local or remotely located from a client access terminal. A CAD drawing is received, is modified and a new CAD drawing is created. The new CAD drawing is changed and enhanced, now containing new characteristics including modification of drawing objects the identification and relationship of electrical components to specific electrical circuits, and more preferably containing new drawing elements including lines representing branch circuit wiring In a general overview, and with reference to FIG. 1, an initial drawings produced by computer assisted drafting, a CAD drawing, includes at least one space having electrical components located therein. The particular space depicted is a kitchen having receptacles of various voltages, lighting and junction boxes. This initial CAD drawing may have had electrical components added manually or by some other process such as that set forth in U.S. Pat. No. 6,999,907 assigned to Draftlogic System, Inc. A computer application program implements various embodiments of the present invention for producing an engineering drawing including having assigned panel and circuit numbers to the various electrical components. For example, the 110V microwave C25 is on circuit 25, panel C and one of the 110V refrigerators is on circuit 24, also on panel C. The electric range, being a 208V appliance, is on a different panel F, circuits 13 and 15. The lighting is on a common circuit 8, panel A. This enables the creation of a circuit panel schedule.

Figure 2:
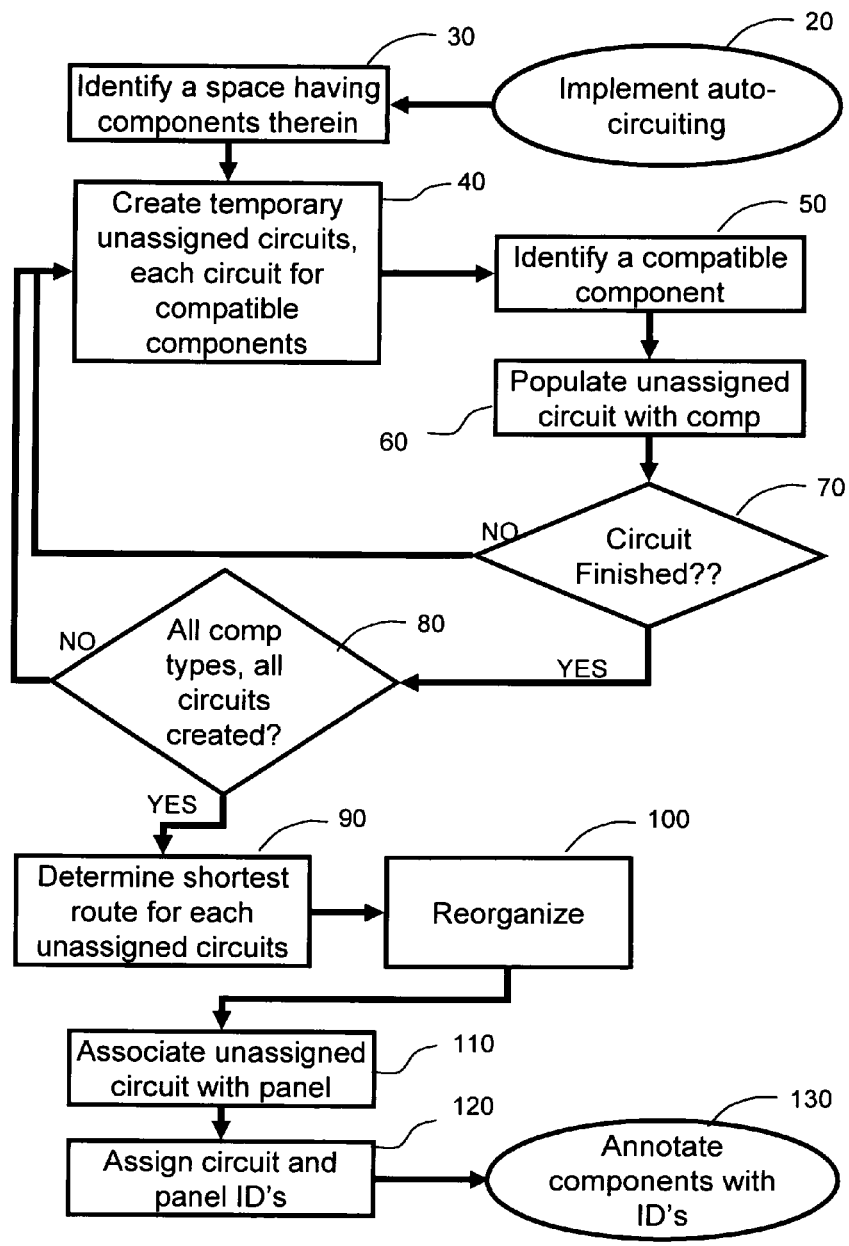
FIG. 2 is a schematic flow chart illustrating an embodiment of the automatic circuiting.

Having reference to FIG. 2, a project is initiated by implementing an application 20 for the process of the instant invention which loads a CAD drawing, the CAD drawing having at least one space having one or more electrical components therein, identifying a service area 30 for a type of service, and creating two or more temporary unassigned circuits 40, each circuit being associated with a compatible type of component of the electrical components. The creation of each temporary unassigned circuit 40 further comprises the steps of: identifying compatible electrical components 50, such as receptacles, lighting components, motors and heaters, populating the electrical components on an unassigned circuit 60, and determining if the circuit is finished 70. If the process determines that the circuit is not finished, then the process will repeat the steps of identifying compatible components 50, populating the components on an unassigned circuit 60 and determining if the circuit is finished 70. If the process determines that the circuit is finished, then process will then determine if there are any components of any kind of service that are not circuited 80.

If the process determines that there are still components available for circuiting, the process will revert to creating a temporary unassigned circuit 40, and repeat the associated steps for creating a temporary unassigned circuit. If the process determines that all components have been circuited, the process proceeds to determine the shortest route for each finished unassigned circuit 90. The finished unassigned circuits are then reorganized 100 for gathering finished unassigned circuits having routes of close proximity to each other and that do not crossover. The reorganized, finished, and unassigned circuits are then associated with a selected panel 110 having a unique identifier such as a circuit identifier and a panel identifier 120. The selected panel is a common panel for gathering of the finished, unassigned circuits. The final product of the process 130 can be a drawing having circuited electrical building system components having circuit and panel identifiers and can also be branch circuit panel schedules.

Figure 3:
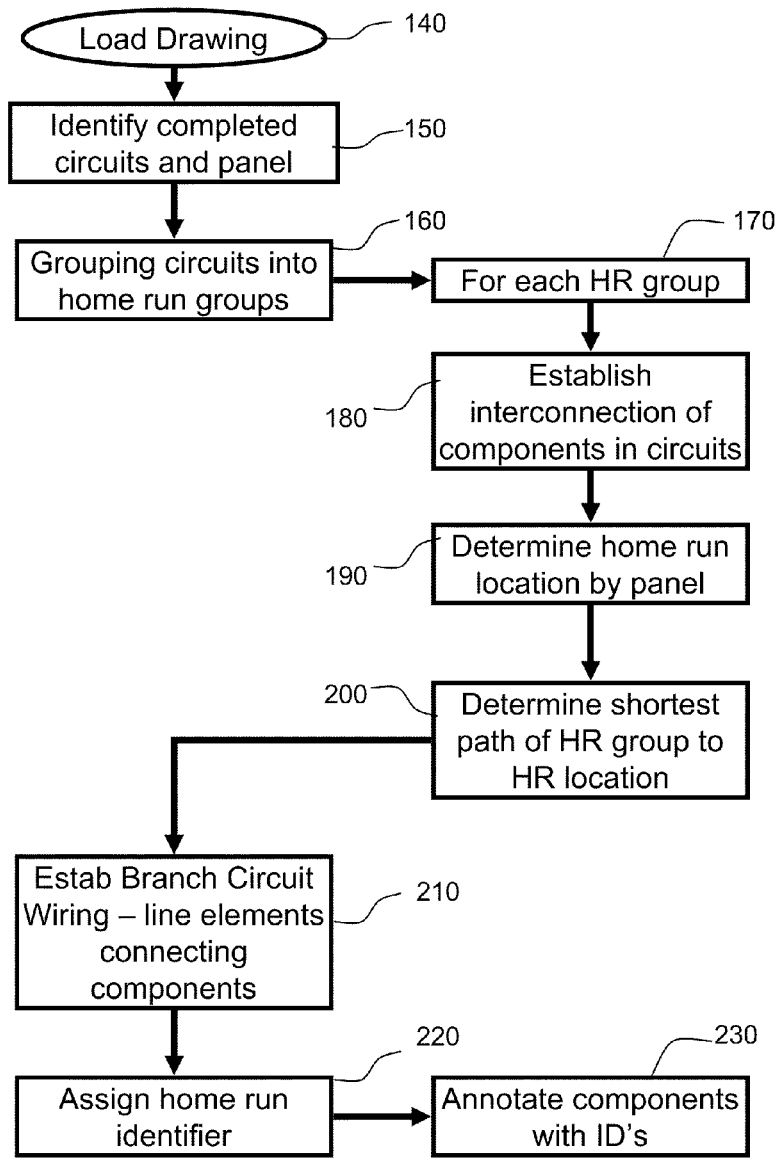
FIG. 3 is a schematic flow chart illustrating an embodiment of the branch circuit wiring.

With reference to FIG. 3, a drawing having circuited building electrical components 140 can initiate branch circuit wiring. The process will further identify the finished circuits 150, and group the finished circuits into one or more home run groups. A single circuit can be grouped as its own home run group if necessary.

The process will repeat the grouping of finished circuits 170 until such time when all the finished circuits have been grouped into one or more home run groups. Within each home run group, the process establishes interconnective relationships between the circuited components 180. Then, based on the interconnective relationships of all of the circuited components, the process will determine a home run location 190, and determine a shortest path of the home run group to the home run location 200. A branch wiring line for each finished circuit is established and drawn 210. The home run location is identified with a home run identifier 220 and a detailed electrical engineering drawing can be produced 230.

Preparing for Automated Circuiting

Figure 4:
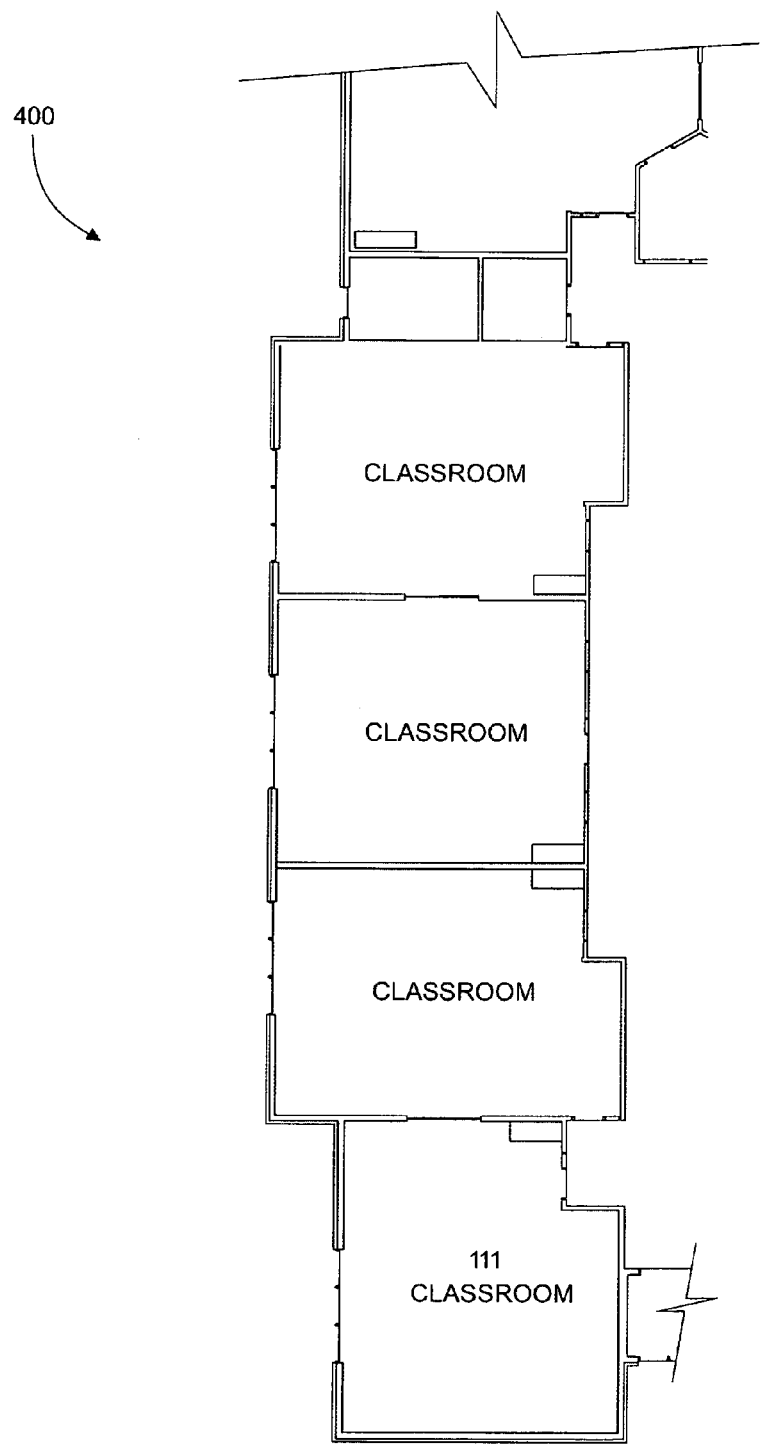
FIG. 4 is a partial view of an architectural CAD drawing illustrating a variety of boundaries or spaces which represent rooms, corridors and service rooms.
Figure 5:
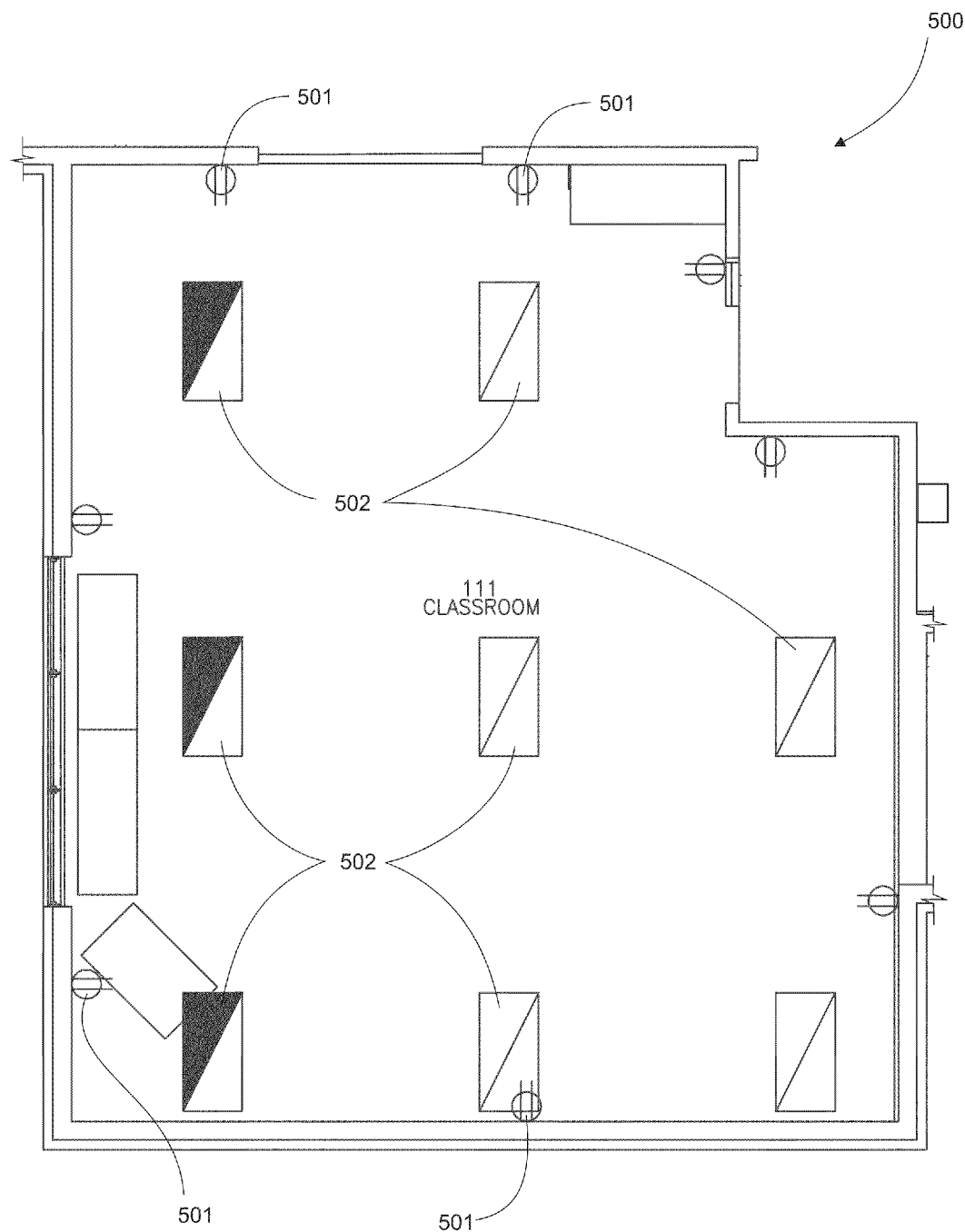
FIG. 5 is one space representing a classroom of a school, in the CAD drawing of FIG. 4, having components including lights and receptacles.
Figure 6A:
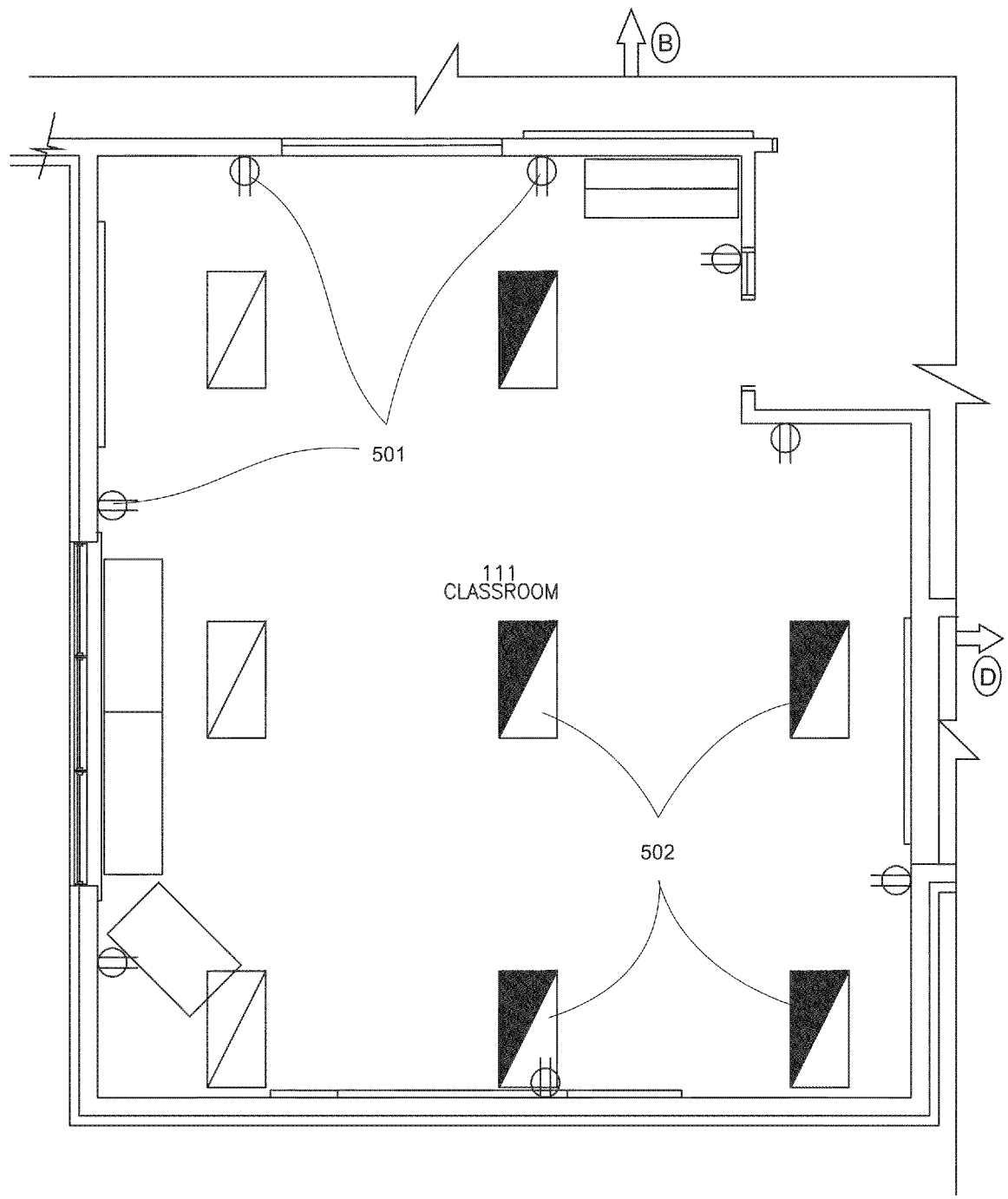
FIG. 6A is a southwest quadrant A of FIG. 6 illustrating a classroom ready for autocircuiting, having lights, and receptacles.
Figure 6B:
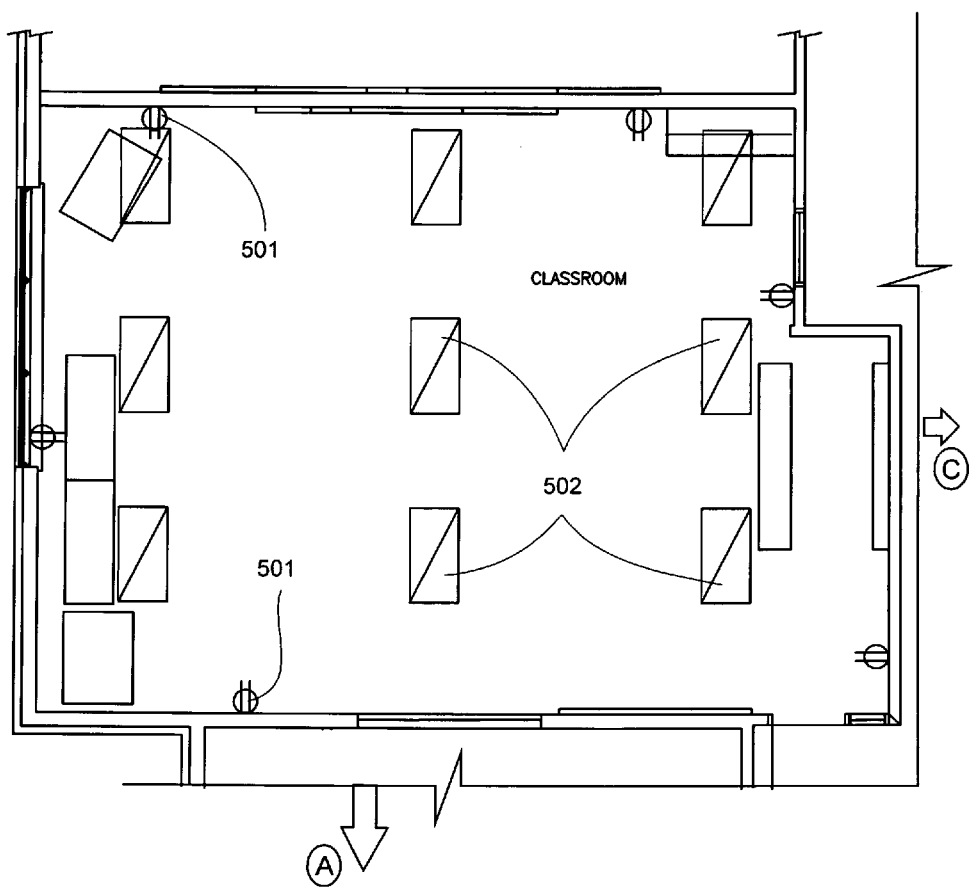
FIG. 6B is a northwest quadrant B of FIG. 6, illustrating a classroom having lights and receptacles, and ready for auto-circuiting.
Figure 6C:
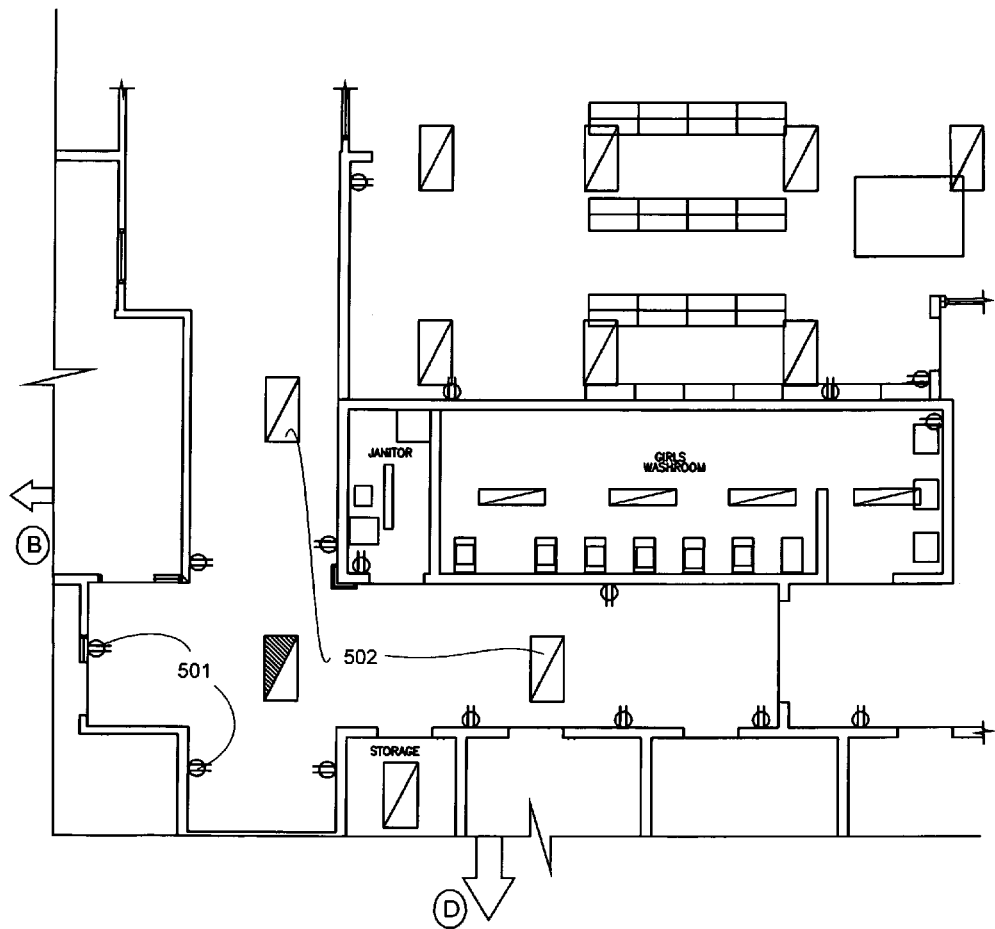
FIG. 6C is a northeast quadrant C of FIG. 6 illustrating a portion of the building, having lights and receptacles, and ready for autocircuiting.
Figure 6D:
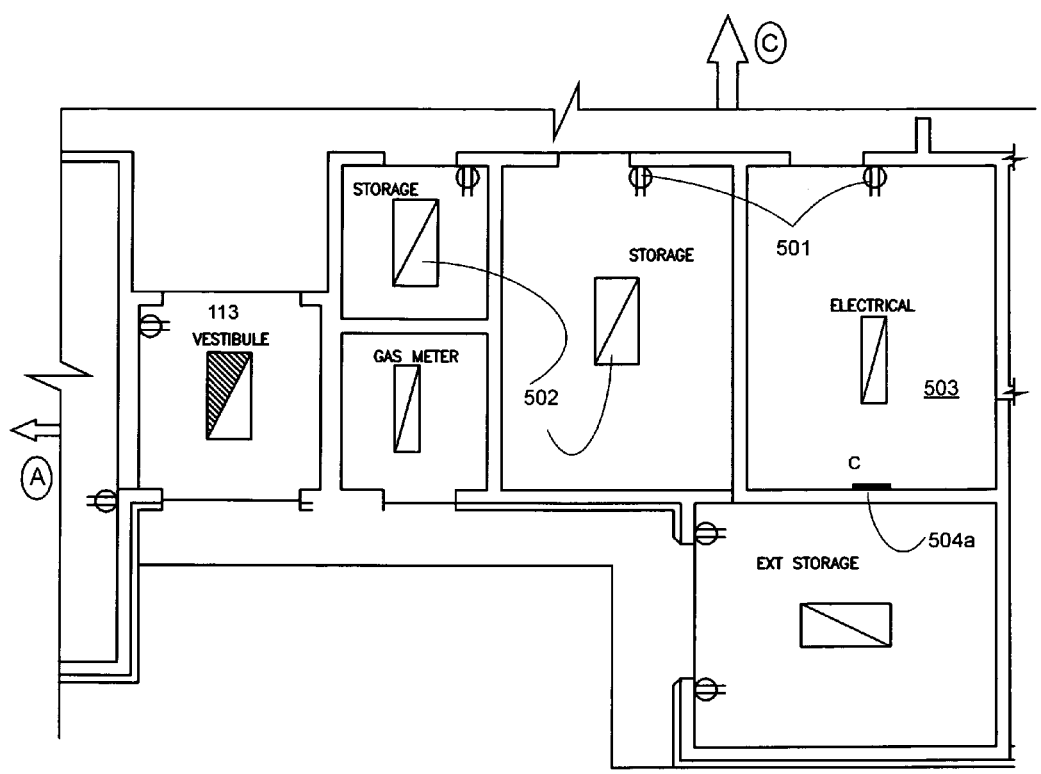
FIG. 6D is a southeast quadrant D of FIG. 6 illustrating a portion of the building, having lights and receptacles, and ready for autocircuiting.

With references to FIG. 4, a raw architectural drawing 400 undergoes automatic placement, as taught in U.S. Pat. No. 6,999,907, for placement of electrical components such as receptacles, lighting, motors and heaters. As shown in FIGS. 5, 6, and 6A to 6D receptacles 501 and lighting components 502 has been placed in each of the various rooms of the raw architectural drawing 400 to produce an engineering drawing 500 having at least building electrical system components.

In an alternate embodiment, the identification of the service are can comprise selecting all of the one or more spaces in the CAD drawing, and the application can associate one or more of the spaces as a panel room. For each type of service, the user can define the parameters to be applied to the project.

With reference to FIGS. 5 to 8D, the process allows the end user to define or select a location of an electrical or panel room 503 or define a particular panel 504 which will service the selected service area. Each selected service area can be designated as mixing lightning and power circuits, segregating lighting and power circuits or be individually for lights or power. Further one can also support emergency service areas to direct emergency powered objects (which can be lights, motors, or other components) to their own panel room or specified panel. Further, large motors can be directed by a project setting to ignore the service area guidance and instead be automatically circuited to a central motor control center or the main distribution panel.

The selected service areas can be directed to either a panel room 503 or a specific panel 504. If the end user selects a panel room 503, the process will search the panel room 503 for existing panels that meet the needs of the current components being circuited. If there are no existing panels, the process will create a new panel to meet automated circuiting needs by determining the voltage of each electrical component on a circuit, the service type of each electrical component and then placing a panel with available panel slots in an appropriate panel room.

In an embodiment, the process automatically determines if there is an existing panel, locates an existing panel, and determines if the existing panel fits the voltage, phase, and service type requirements.

The process further determines a panel room for the selected electrical components and checks for an existing panel with the same voltage and service type that has unallocated or unassigned panel slots. If an existing panel with space is found in the associated panel service room, this panel is used for circuiting until it runs out of available panel slots. The process would then look for another panel in the room with the same voltage and service type with unallocated slots.

If more than one panel is found, within the selected panel room, having the same criteria (voltage and service type), the first panel found will be used. If the process does not locate a panel meeting the criteria for voltage and service type, the process will automatically place a panel in that selected panel room or location.

Components selected to be powered by emergency power sources are only circuited to a panel designated for circuiting emergency powered devices.

Automated Circuiting

Referring back to FIGS. 5, 6, and 6A to 6D, the process determines a number of rooms within the selected service area, for the selected service type. The process then identifies or classifies the type of each room and examines each room to identify all electrical components, including receptacles 501 and lighting components 502, and the location of each component.

Figure 22B:
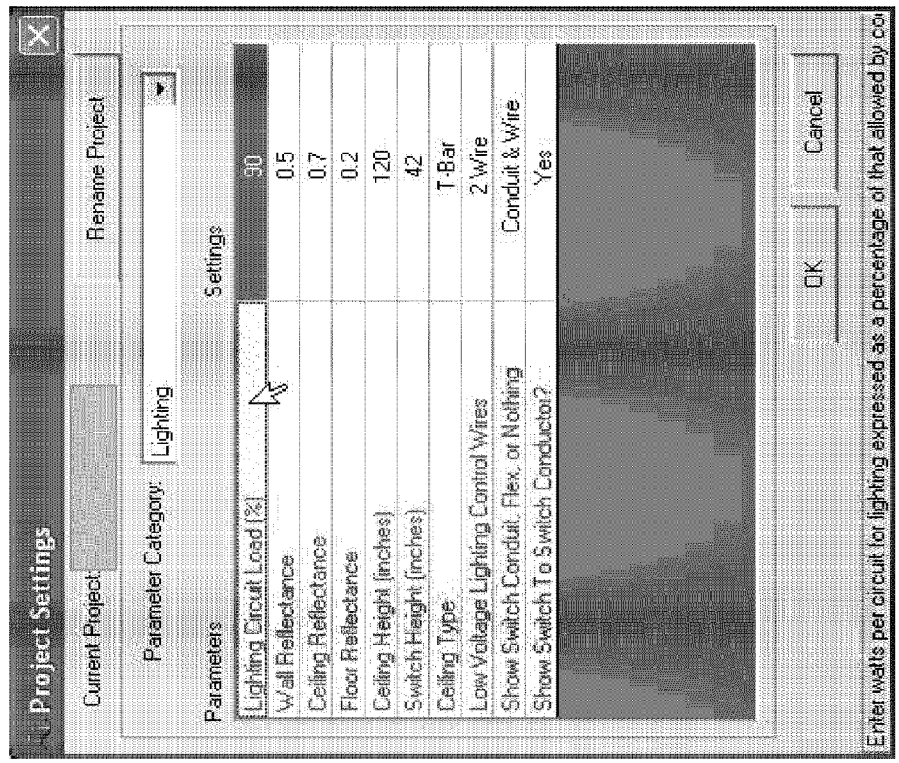
FIG. 22B is example of an application dialog for illustrating sample parameters for components such as lighting.
Figure 22A:
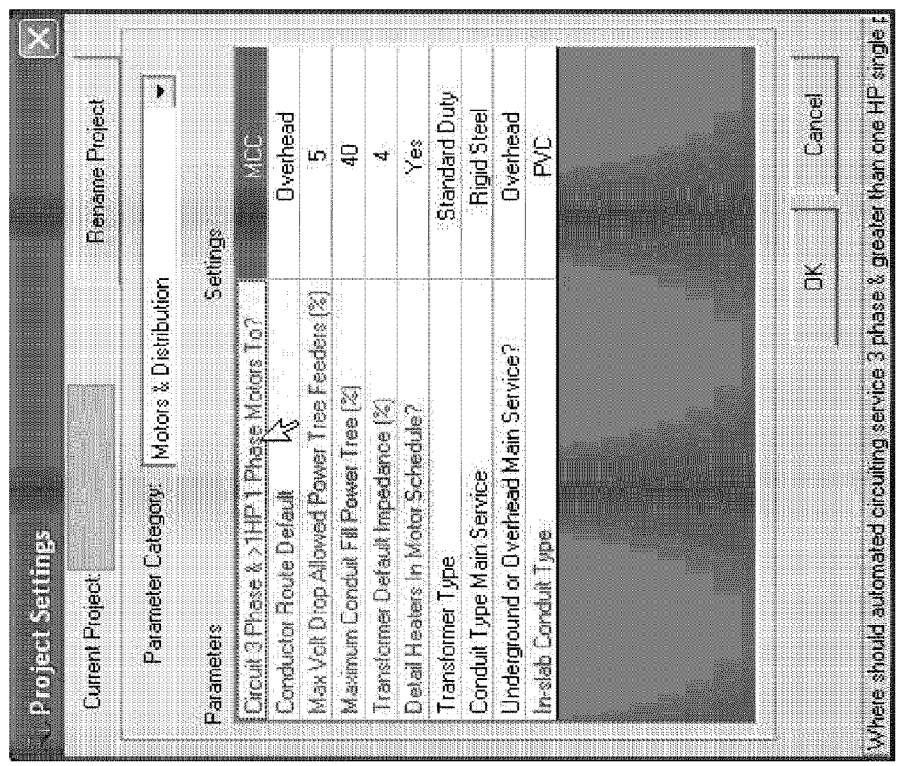
FIG. 22A is example of an application dialog for illustrating sample parameters for components such as motors and distribution.
Figure 23B:
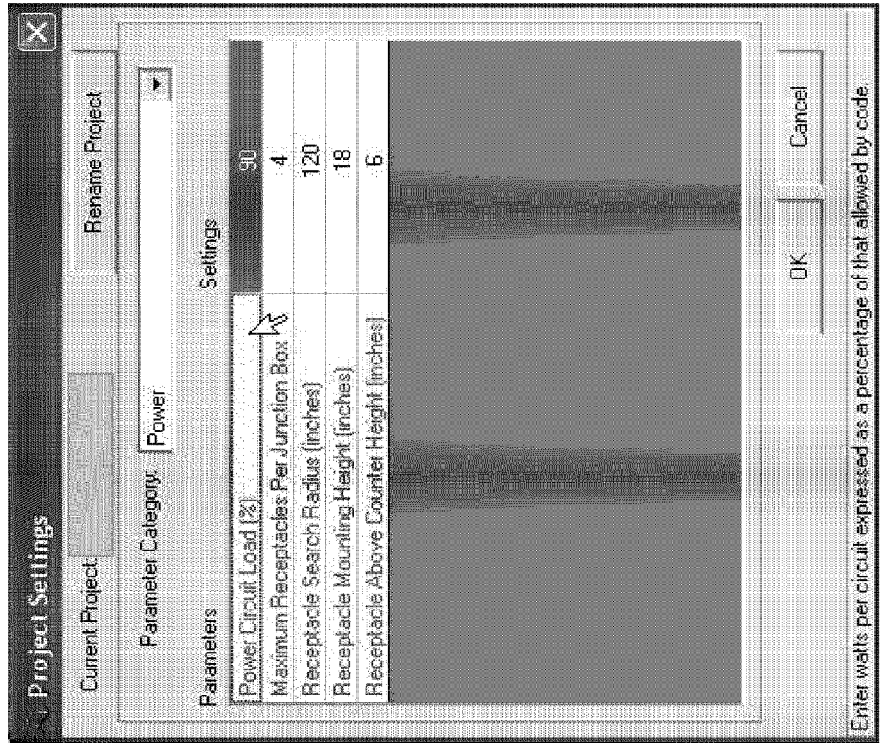
FIG. 23B is an example of an application dialog for illustrating sample power parameters.
Figure 23A:
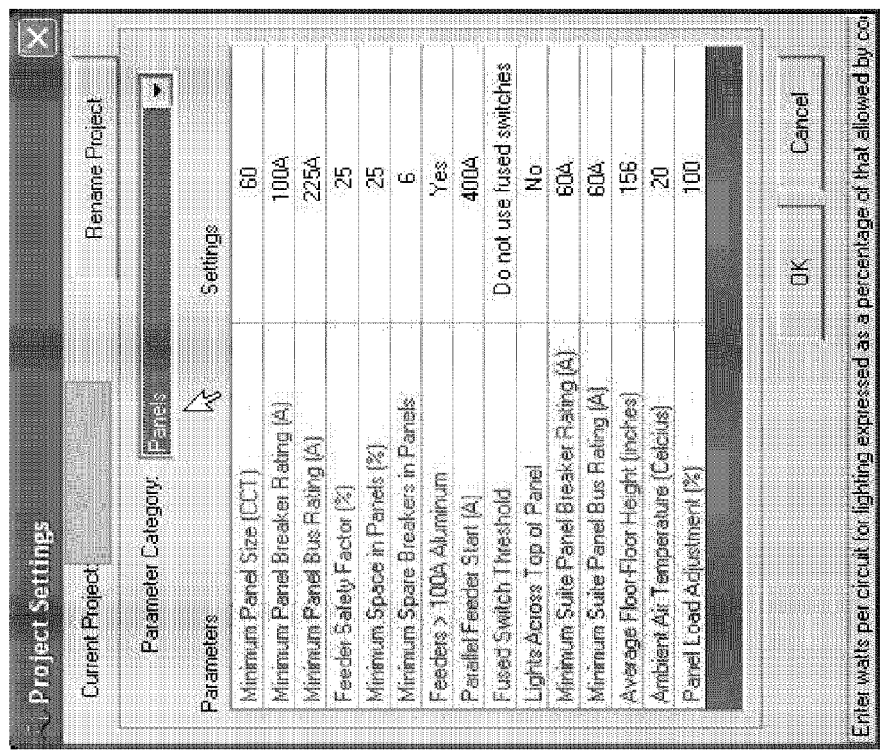
FIG. 23A is an example of an application dialog for illustrating sample parameters for panels.

For each component, the process, using a database of standards including the Canadian Electrical Code (CEC), the National Electrical Code (NEC), specific standards, and client specific parameters (as shown in FIGS. 22A and 22B), identifies one or more parameters, such as load and voltage requirements, and service type. After identifying each component to be serviced or circuited, the process determines a maximum circuit limit, such as a maximum circuit amperage for lighting circuits and maximum electrical load for receptacle circuits for each circuit to be created. The process then populates a circuit, interconnecting all of the like components, such as components having the same voltage and service type.

Automated circuiting, by default, creates a single-pole 15-amp breaker under the CEC and a 20-amp breaker under the NEC. The process calculates the required amperage using the following formula:

$$\text{(required watts)}/\text{(volts)}=\text{amps} \quad \text{(Formula 1)}$$

Motor protection is calculated by first determining a full load amperes of the motor. The horsepower, voltage and phase attribute values of the motor are cross-referenced with standards set out by the CSA.

For each circuit, the process determines or calculates a total circuit load possible using the following formula:

$$\text{(total watts)}=\text{volts} \times \text{amps} \quad \text{(Formula 2)}$$

The maximum building code circuit limit is hard coded into the application and set at 80% of the total circuit load possible. This 80% limit is not alterably by the end user.

$$\text{Building Code circuit Limit}=\text{Total circuit load} \times 0.8 \quad \text{(Formula 3)}$$

For safety purposes, the application establishes a maximum project load or maximum circuit load for lighting and power circuits during automated circuiting. By default, the maximum circuit load percent has been set at 90%. That is, the maximum project load is set at 90% of the building code circuit limit. AS shown in FIG. 22B, the maximum circuit load percent can be altered by the end user, and set up as part of a client specific module or parameters.

As each electrical component is populated or added to a temporary unassigned circuit, the process calculates a running total of the load placed on the temporary unassigned circuit, compares the running total against the determined maximum project load (maximum circuit load), and determines if the circuit has sufficient capacity to populate another compatible component. If the addition or population of another compatible component to the temporary unassigned circuit does not cause the running total load to reach the maximum circuit load, the compatible component is added. If the addition of another component causes the running total load to exceed the maximum circuit load, the process will not add the component to the circuit and will create another circuit.

For example, for a lighting circuit for a project in Canada, using 120 V devices, the total watts for the circuit, using Formula 2, is calculated to be 1800 W (120 V×15 amps). The building code circuit limit is 80% of the total watts, and thus calculated, using Formula 3, to be 1440 W.

The maximum project circuit load is set at 90% of the building code circuit limit, and thus, calculated to be 1296 W. That is, the process will circuit compatible components such that the running total of the load placed on that particular circuit will not exceed a total of 1296 W. The process will allow the addition of compatible components onto this particular circuit so long as the running total load placed on the circuit does not exceed the 1296 W. If the addition of a subsequent compatible component causes the running total to exceed 1296 W, the process will not add the subsequent compatible component and would instead create a subsequent circuit.

Circuit Population

Automated circuiting begins with a room, within the determined service area, furthest away from the selected or determined panel room 503. For each type of service, a compatible components is populated to a temporary unassigned circuit. Within the room, the process can arbitrarily pick a component as a starting point for the unassigned circuit, and travel about the perimeter of the room locating wall mounted components, and/or travel in a row and column fashion for locating ceiling or floor mounted components. As the process travels about the room, the process will identify a compatible component, retrieve at least one parameter of the component, the at least one parameter being related to a maximum circuit limit, sequentially populate the compatible component to the unassigned circuit, calculate a running total of the at least one parameter, and compare the running total with the determined maximum circuit limit. The circuit finishes when either the running total approaches but does not exceed the maximum circuit limit or when the circuit is populated with and has exhausted all the compatible components within the room. In the latter case, the circuit continues to have remaining capacity for more compatible components. The circuit can also finish when the process determines that the circuit cannot be shared with neighboring rooms.

If the circuit is deemed to be finished because it has populated and exhausted all of the compatible components in the room, the process can then locate a neighboring room and determine if the neighboring room qualifies to share the temporarily unassigned circuit.

For a lighting circuit, a neighboring room qualifies to share the circuit if the lighting components 502 on a common switch in the neighboring room has a total wattage that does not cause the circuit to exceed the maximum circuit load. That is, if the total wattage of the lighting components 502 on a common switch in the neighboring room, does not cause the running total load to exceed the maximum circuit load, all of the lighting components on that common switch are connected to the circuit and the circuit is shared between the room and the neighboring room.

The process will also consider if the circuit is capable of servicing all the lighting components 502 in the neighboring room, even if they are not on a common switch. This prevents a small portion of the lighting in a room from being assigned and connected to one circuit, while the remaining portion being assigned and connected to a separate circuit, instead of all being serviced on a same circuit.

Similarly, for a circuit servicing receptacles, a neighboring room can qualify if the addition or population of the receptacles 501 will not cause the circuit to exceed the maximum wattage per circuit. If it does, then a new circuit is created, and if not, then the receptacles 501 will be populated to the circuit. Similar to lighting, the process will determine if there is sufficient capacity to service all the receptacles 501 in the neighboring room to prevent a small portion of the receptacles being added while the remaining portion is added to a new subsequent circuit.

For each shared circuit, the order of travel from room to room is based on a shortest room to room path when populating the shared circuit between neighboring rooms. When going into a neighboring room, the process will continue populating the circuit beginning with the compatible component nearest the room that the circuit just left. The order of travel for each circuit is then modified to optimize circuit assignments on a panel, after each circuit is finished.

After the modified order of travel between rooms for a circuit is determined, the process then reorganizes the unassigned circuits panel based on circuits having routes of close proximity without crossovers. The gathering the unassigned circuits to a common panel further comprises phase grouping gather circuits. Circuit and panel identifiers are then associated with each assigned circuit.

Figure 7:
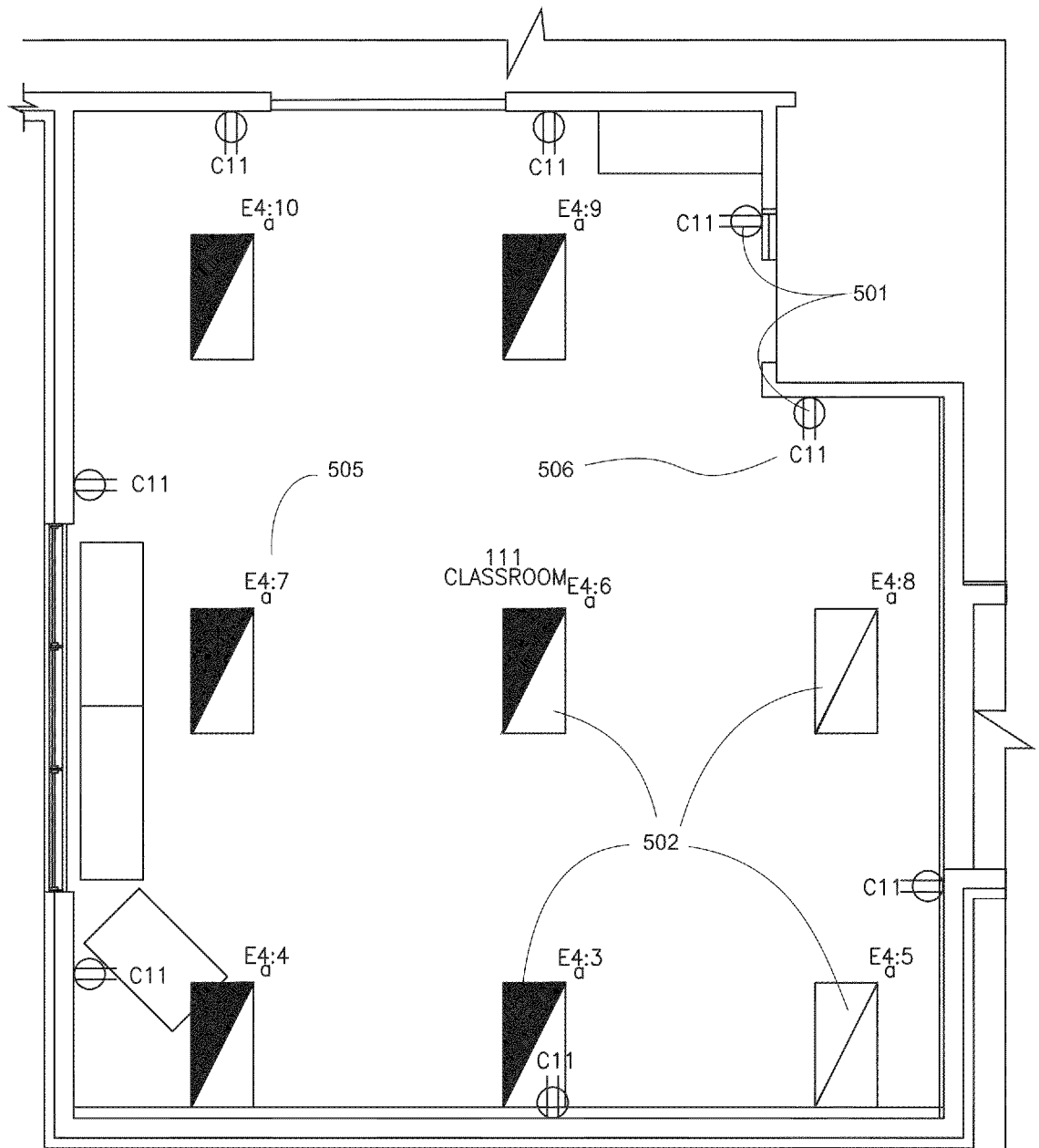
FIG. 7 is the classroom of FIG. 5, located in quadrant A, having being auto-circuited for assigning circuits and panels to each type of components located therein.
Figure 8A:
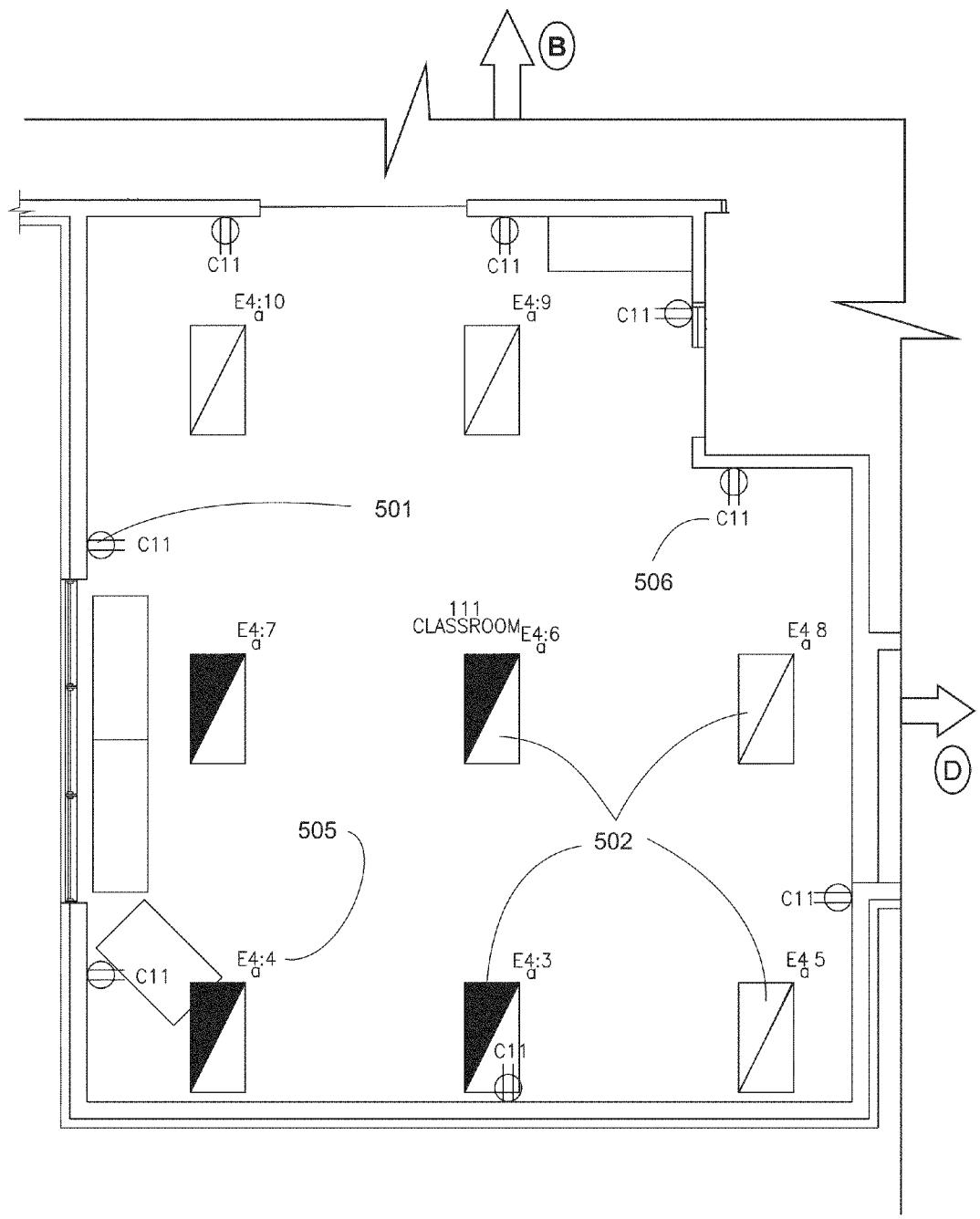
FIG. 8A to 8D are the quadrants of FIG. 6, wherein an embodiment of the application has been applied for auto-circuiting, assigning circuits and panels to each type of components located therein.

As shown in FIGS. 7 and 8A, each electrical component is assigned to a circuit which is assigned to a specific panel and panel slot. The receptacles shown in FIGS. 7 and 8A are identified at 506 as being assigned to circuit C11, while the lighting components at 505 are identified as being assigned to circuit E4. Circuit C11 refers to the circuit assigned to panel C, and the 11$^{th}$ circuit assigned to that panel. Circuit E4 refers to the circuit assigned to panel E, and the 4$^{th}$ circuit on panel E.

Figure 8B:
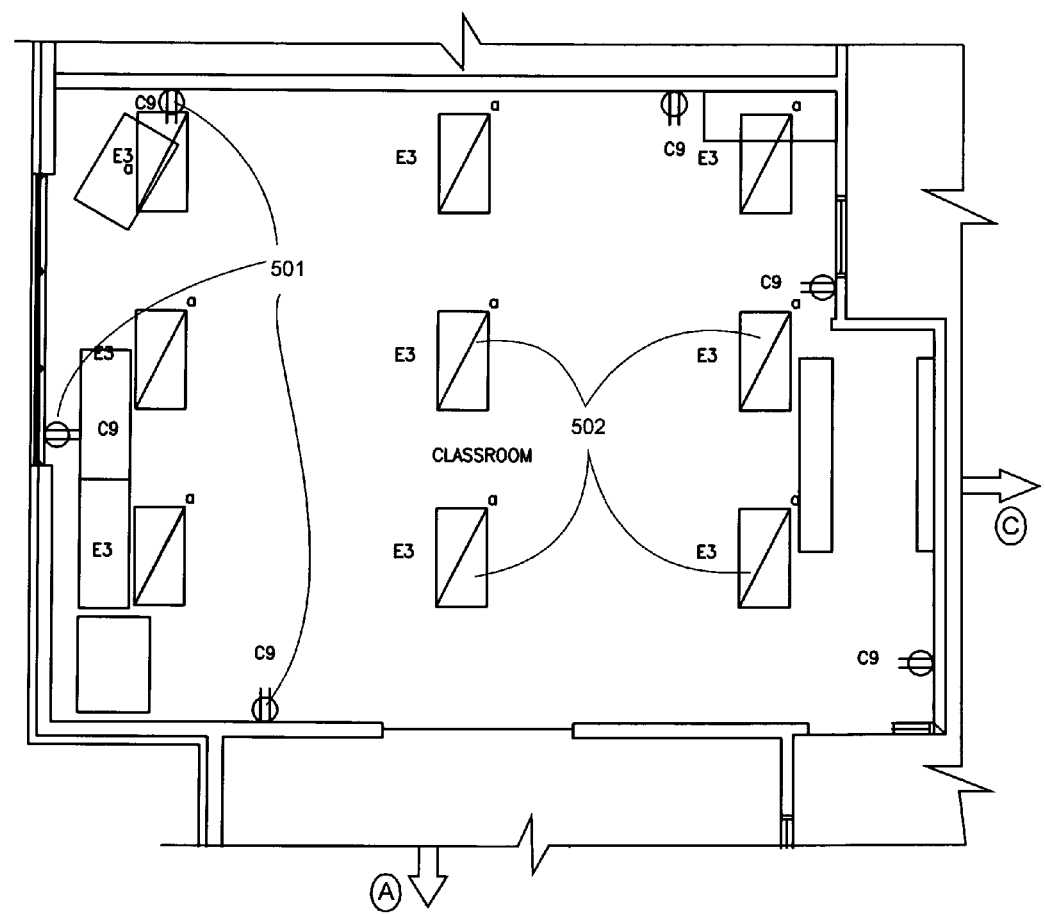
Figure 8C:
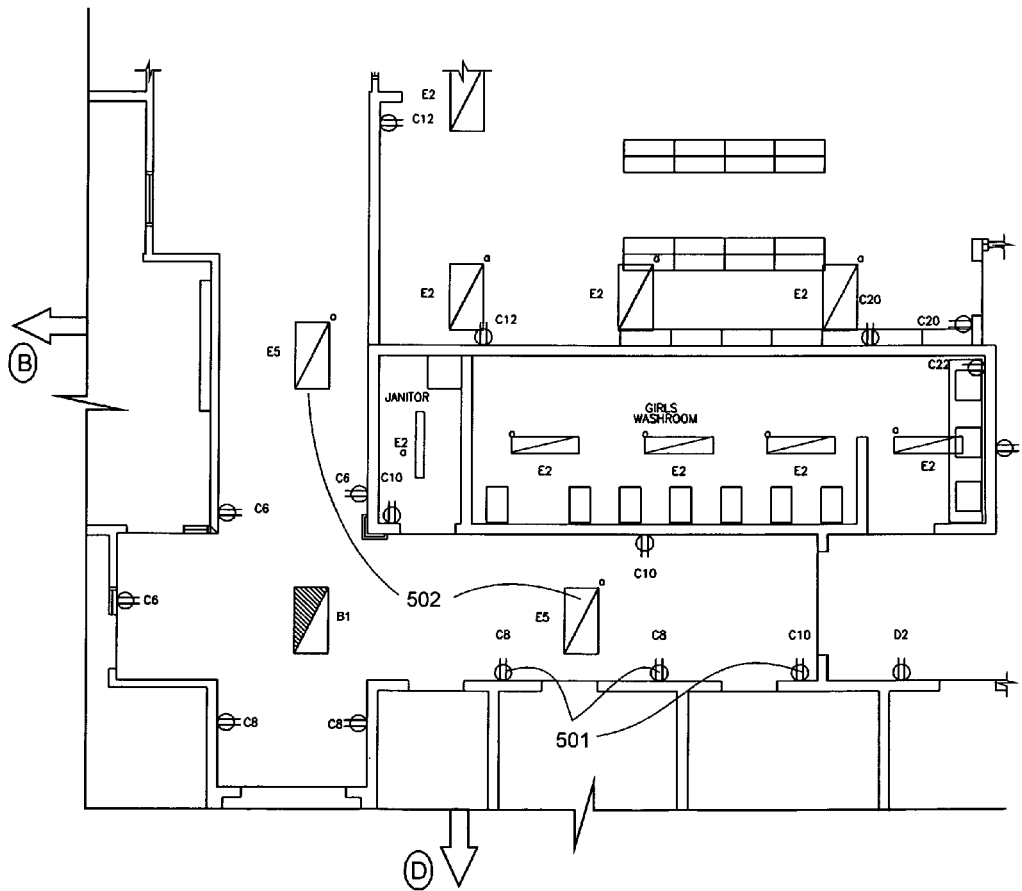
Figure 8D:
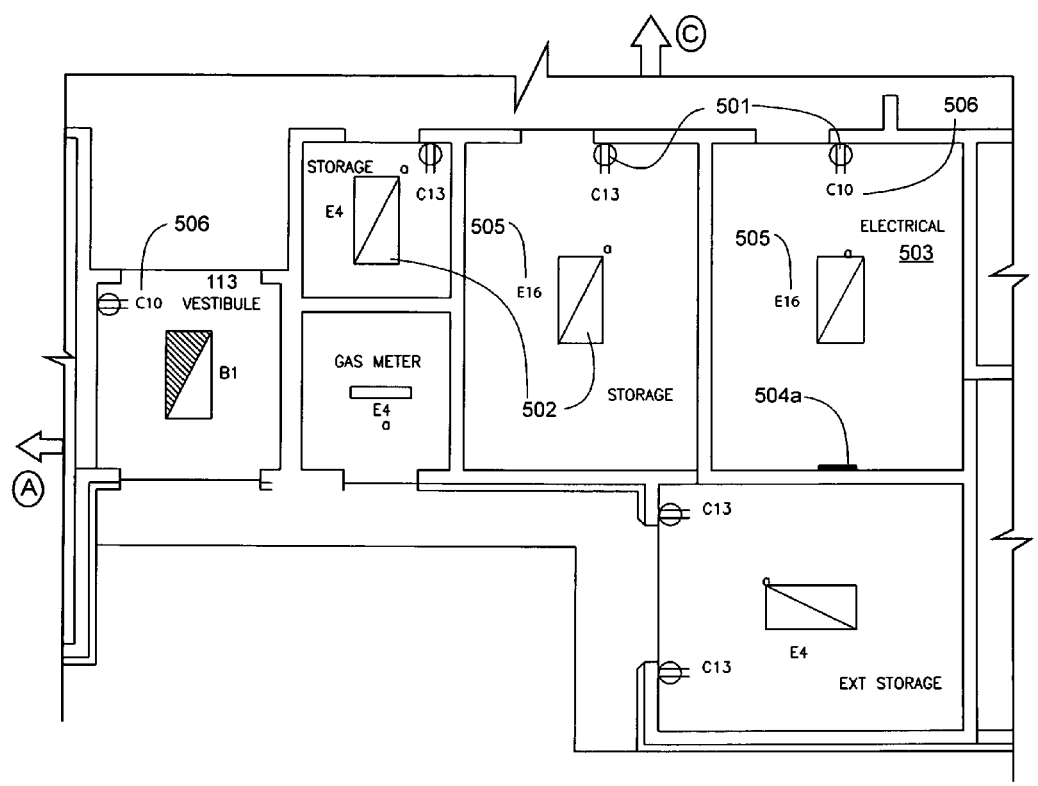
Figure 11A:
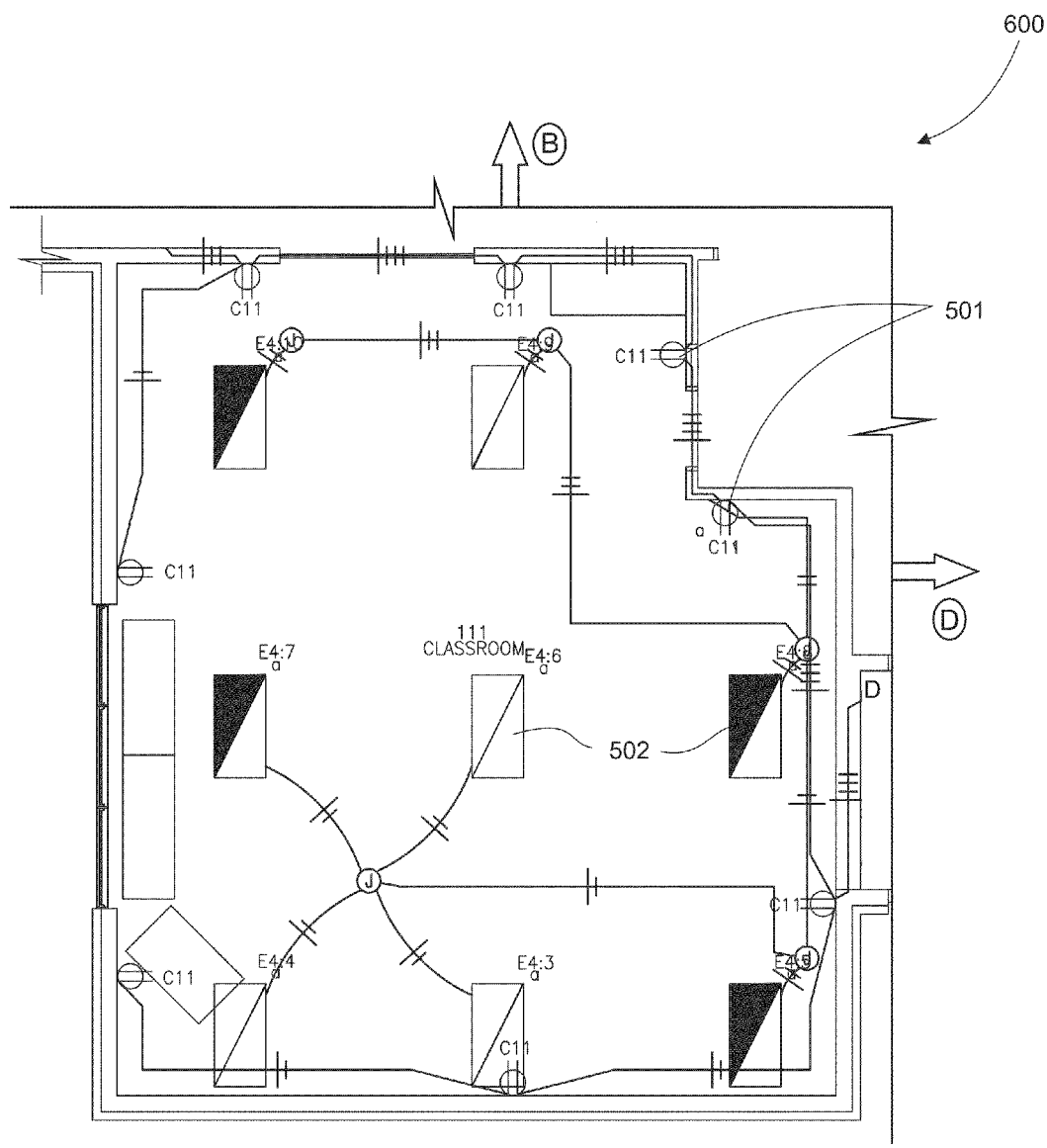
FIGS. 11A to 11D are the quadrants of FIG. 6, wherein an embodiment of the application has been applied for branch circuit wiring for illustrating home run grouping for receptacle components and lighting components.
Figure 11B:
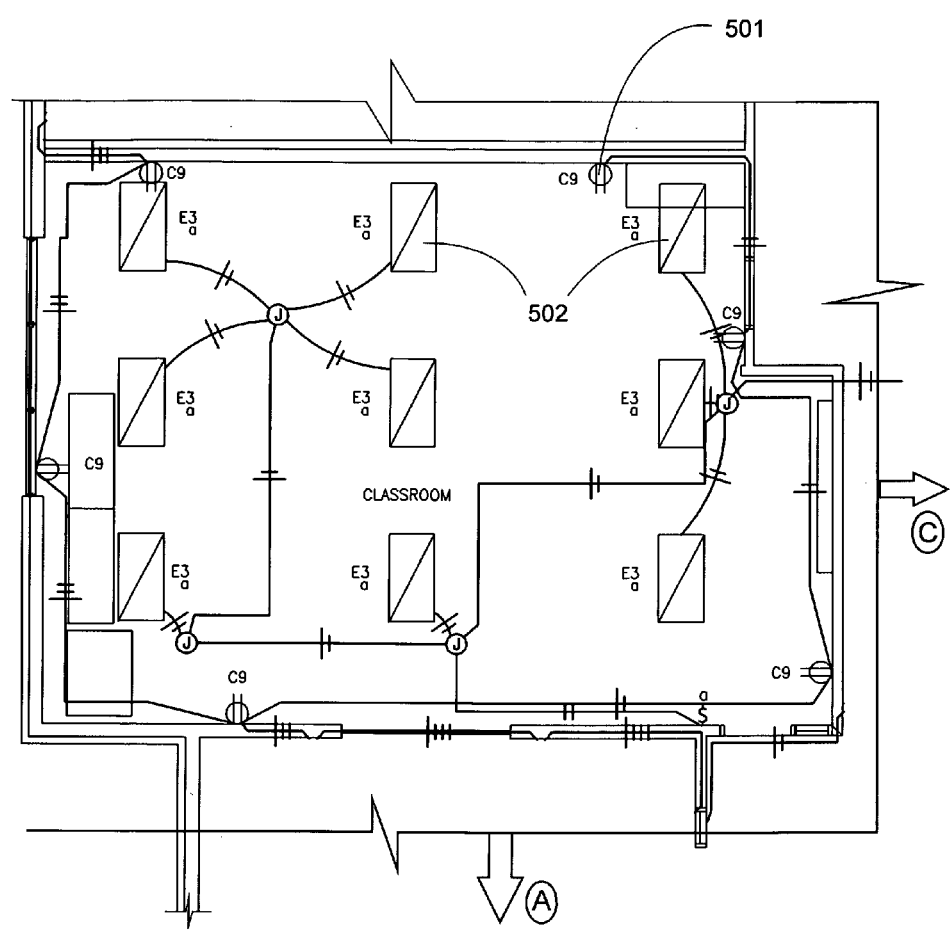
Figure 11C:
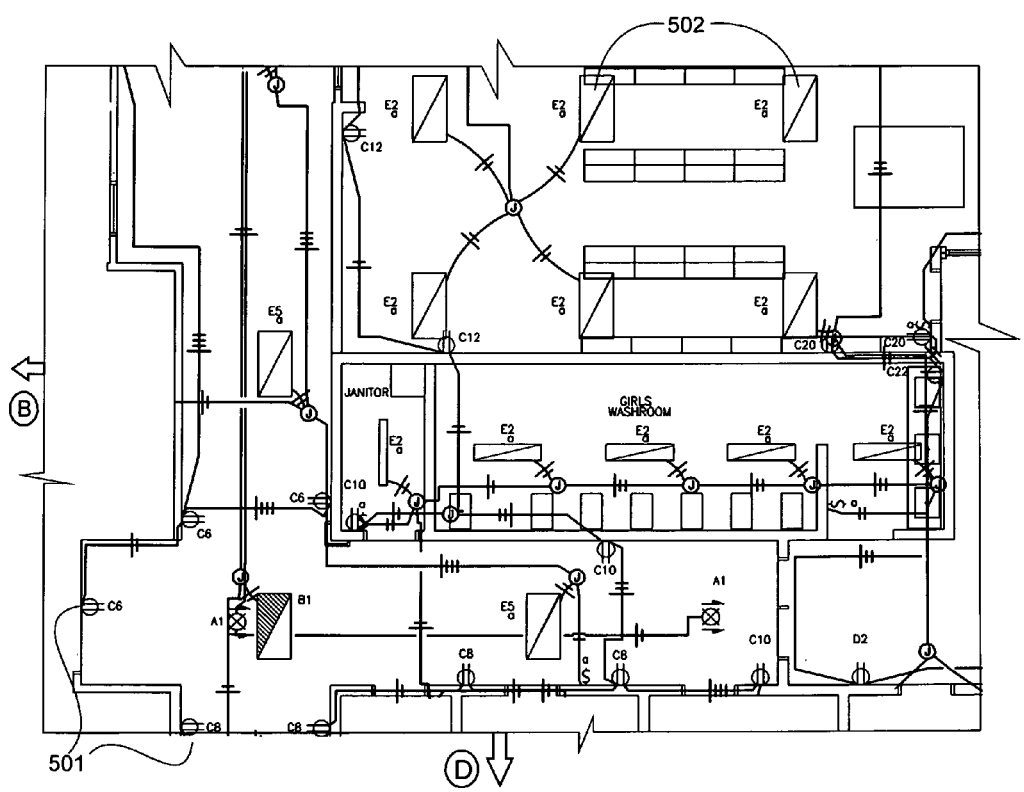
Figure 11D:
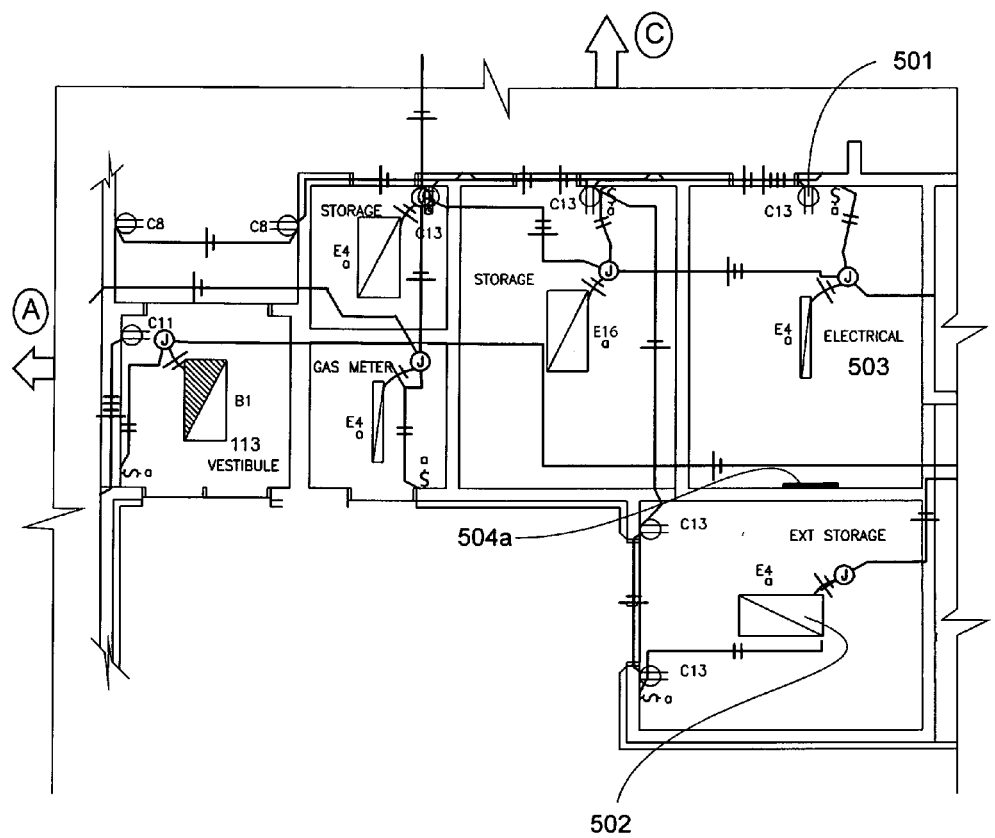
Figure 12A:
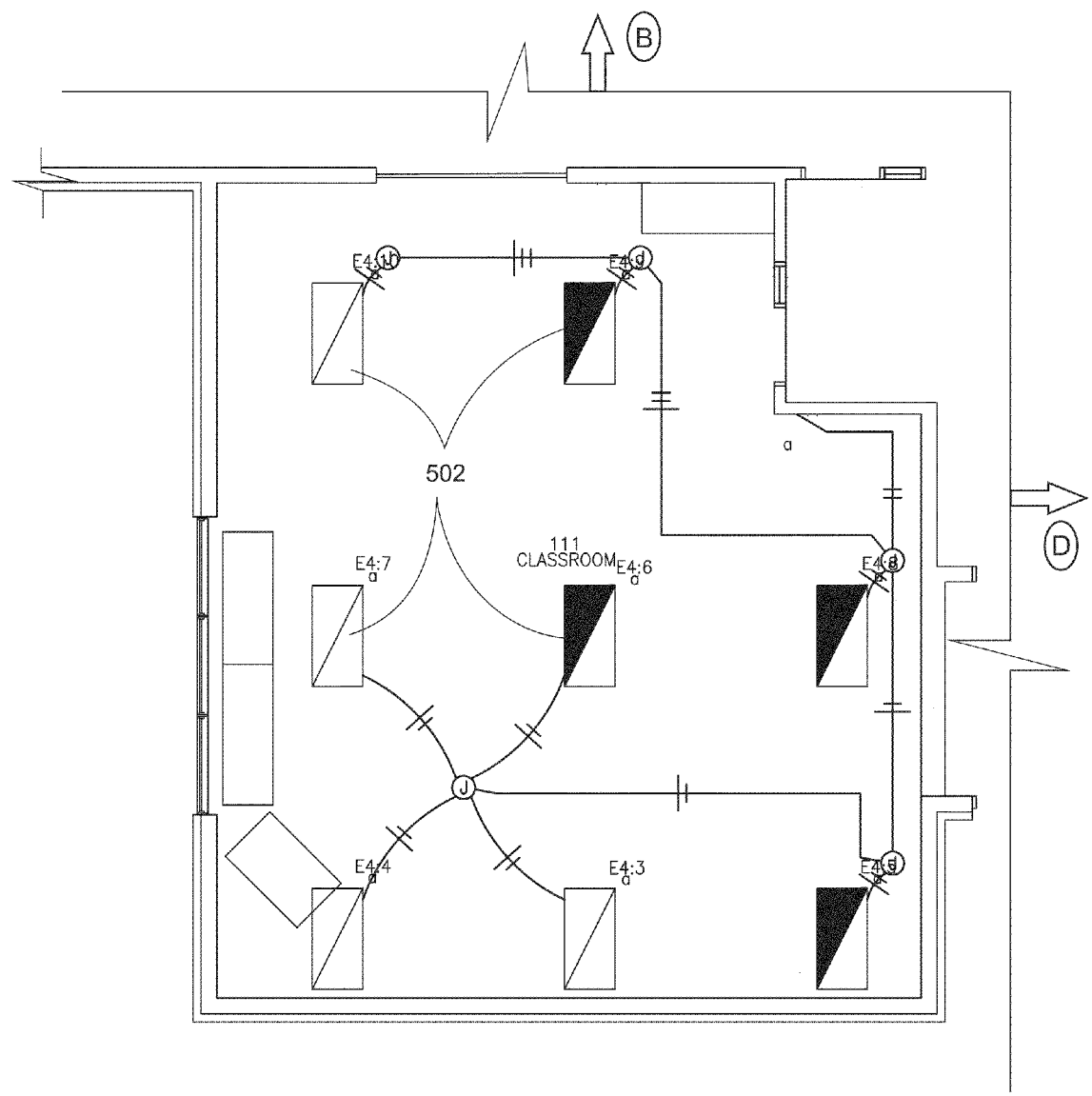
FIGS. 12A to 12D illustrate the home run grouping for just the lighting according to FIG. 11.
Figure 12B:
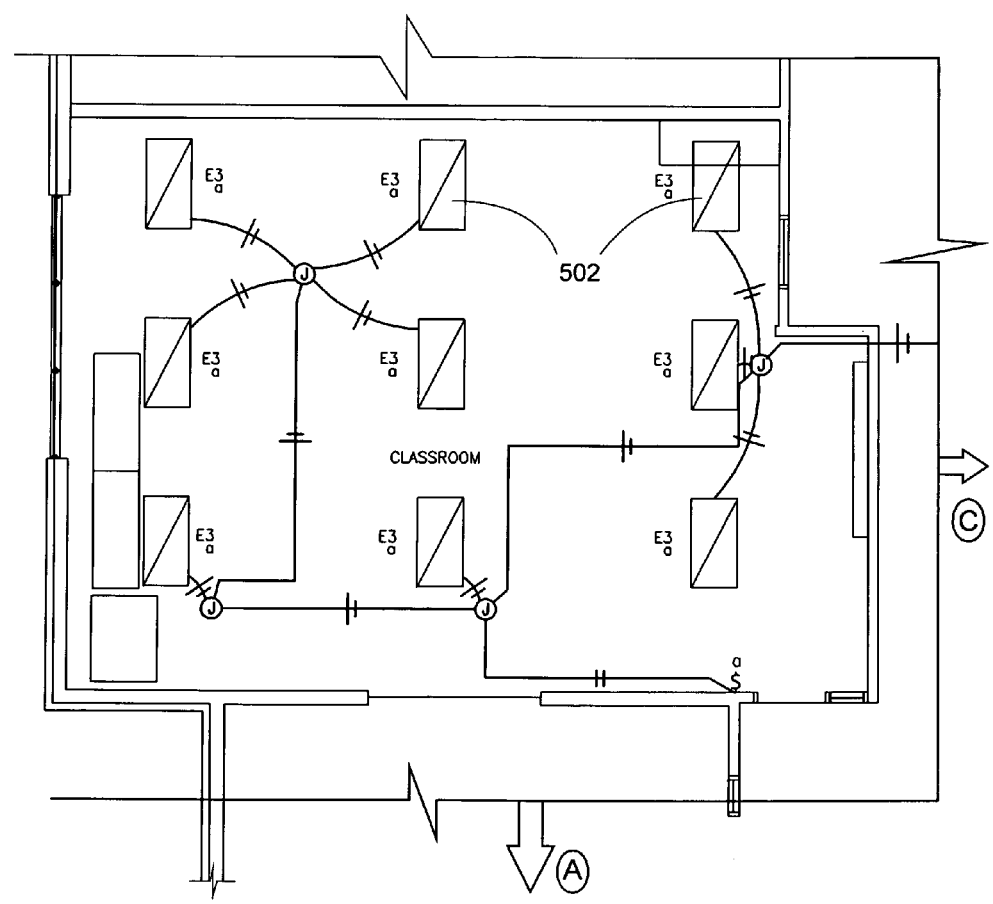
Figure 12C:
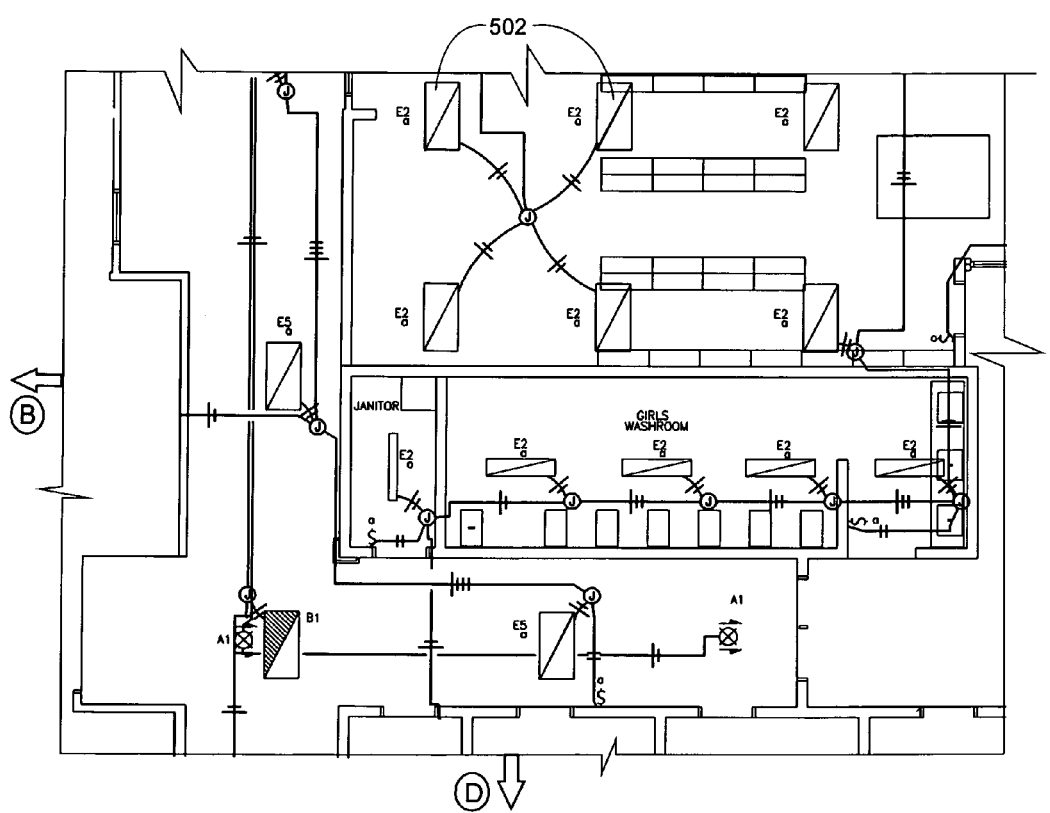
Figure 12D:
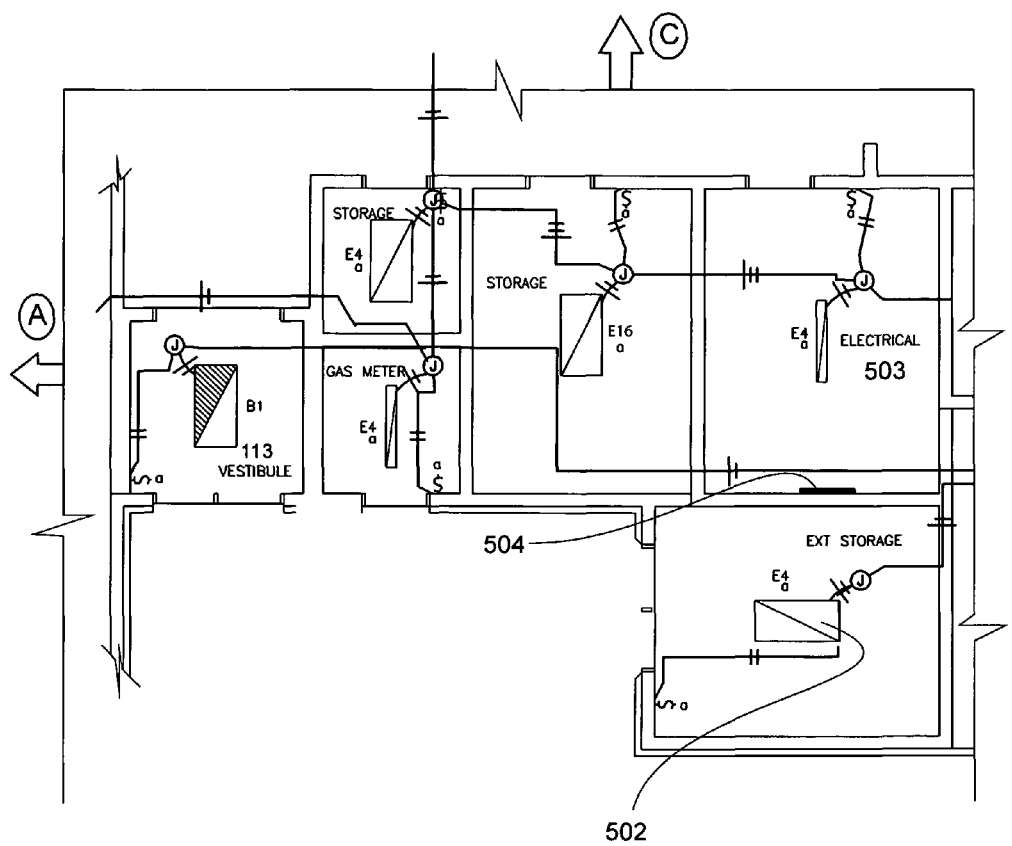
Figure 13A:
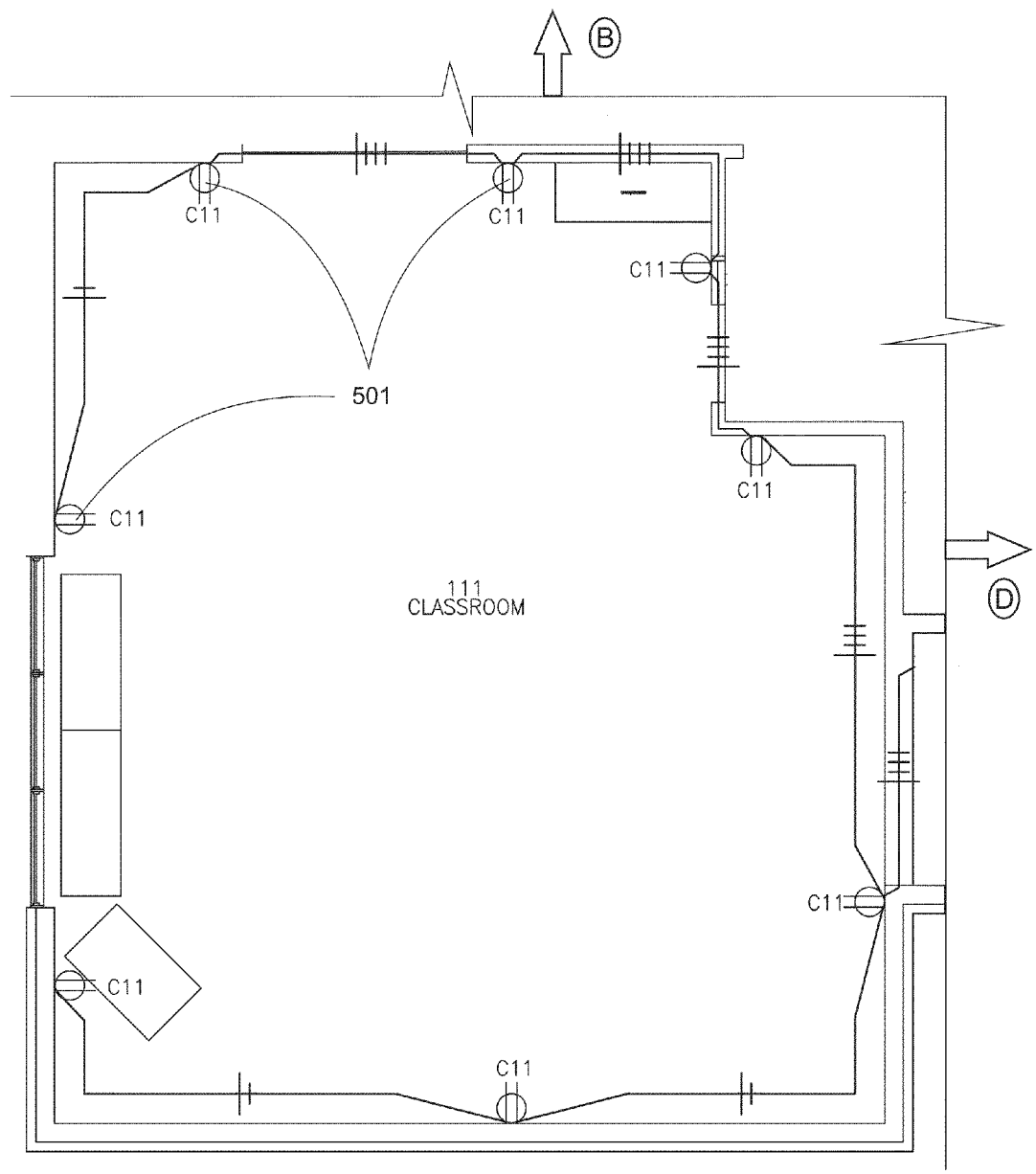
FIGS. 13A to 13D illustrate the home run grouping for just the receptacles according to FIG. 11.
Figure 13B:
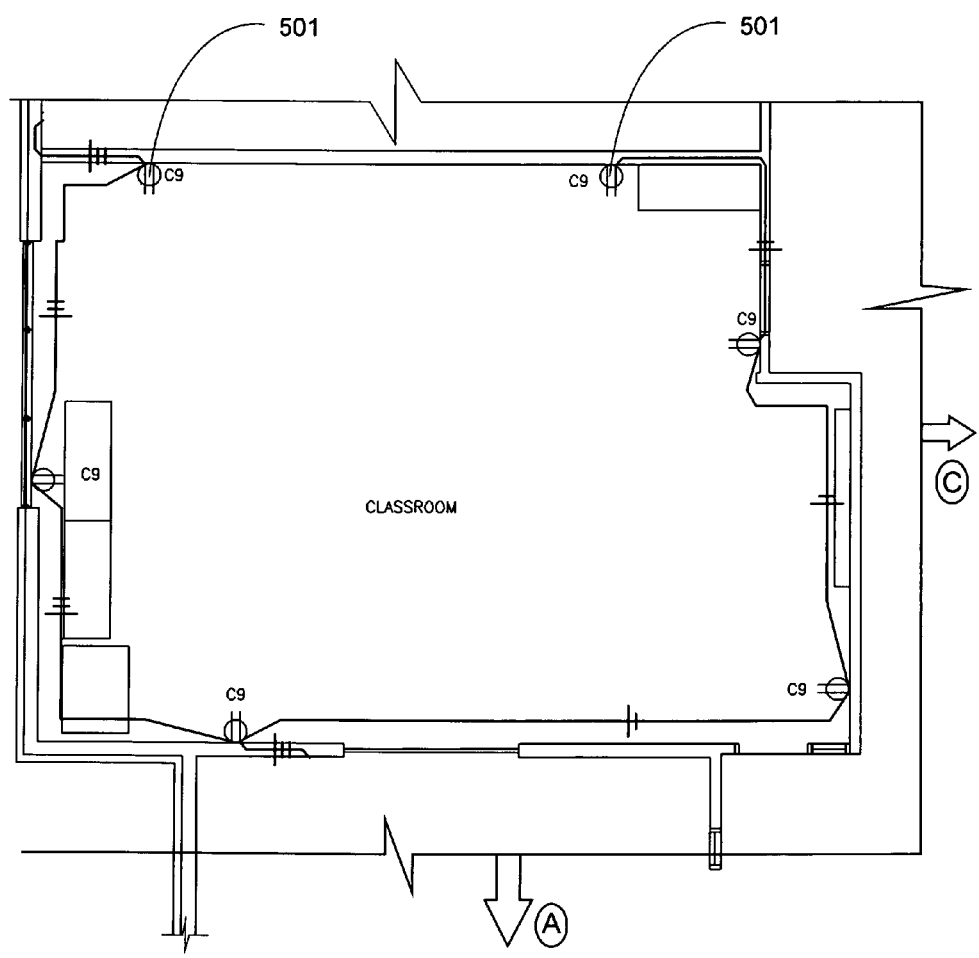
Figure 13C:
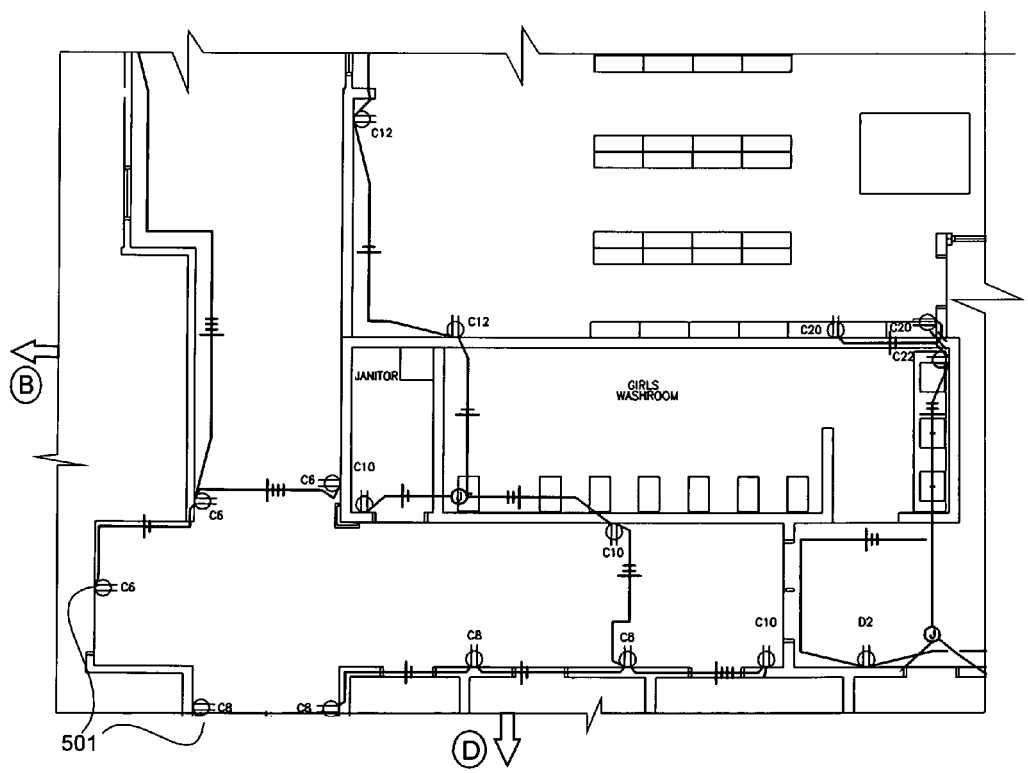
Figure 13D:
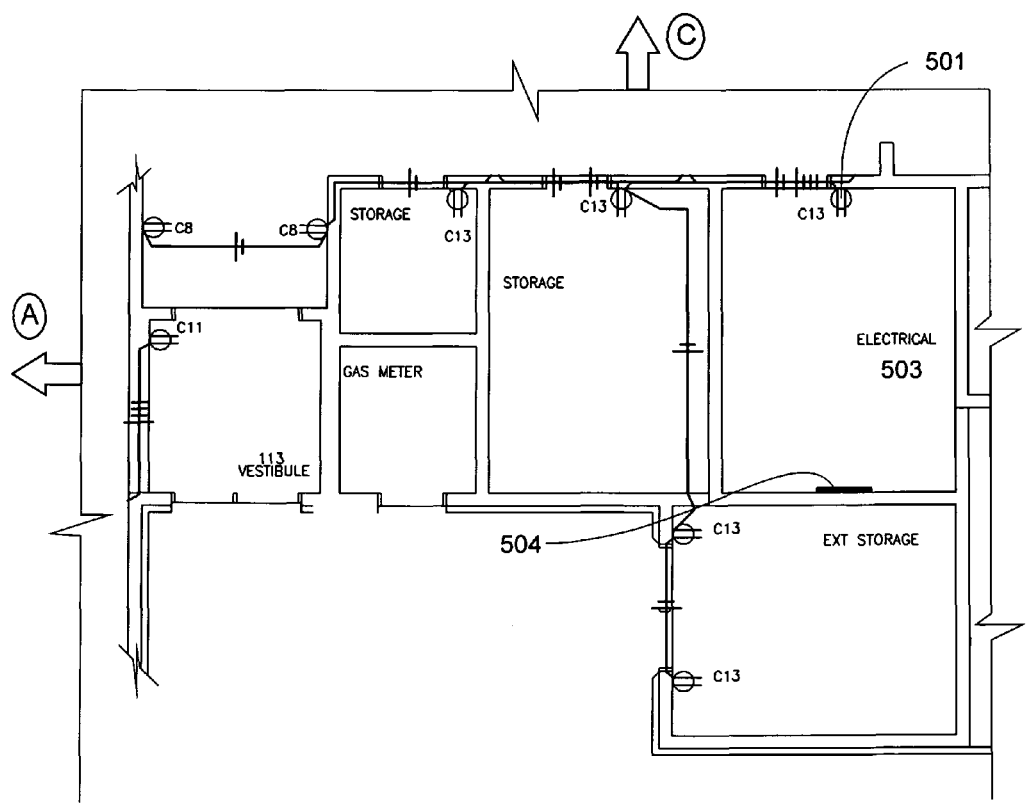

FIG. 8B illustrates receptacles assigned to circuit C9 and lighting assigned to circuit E3, while FIG. 8C has receptacles assigned to circuits C6, C8, C10, C12, C20 and C22 and lighting assigned to circuits E2, and E5. FIG. 8D shows receptacles assigned to circuits C11 and C13, and the lighting assigned to circuits E4.

Referring to FIGS. 9 and 10, panel slot assignments for finished circuits are such that circuits of compatible types are grouped together and assigned to available adjacent panel slots. For example, a first finished circuit is assigned to a first available slot in the selected panel. A second or subsequent finished circuit of a compatible type, and having the same type of phase group is assigned an adjacent available panel slot. An adjacent available panel slot can be side by side the first available slot for a three phase panel, and can be above, below or side by side for a single panel.

The panel schedule identifies each circuit, the number of components on each circuit, the phase of each circuit, description of each circuit and the parameters of each circuit.

For example, Circuit C11 is a C phase circuit, having a total wattage of 1100 W. Circuit C11 services "classroom 111" and "vestibule 113".

In an alternate embodiment, and with references to FIGS. 23A, 24B, 25B, and 26, the end user can manually place a panel in a specific room. Manual panel placement requires the end user to define various parameters of the panel to be placed, such as size of the panel, the minimum panel breaker rating, diversity of the various service types to be assigned to the panel, how the panel is to be placed, the voltage that the panel can handle, and the phase type of the panel. Once placed, the end user must identify spare and unavailable panel slots for that particular panel, and then identify those rooms or electrical components that are emergency powered.

Branch Circuit Wiring

With reference to FIGS. 11 to 21, once each circuit is assigned to a specific panel and identified, the process can produce a branch circuit wiring drawing 600. The process draws the branch circuit routing for lighting, receptacles and motors, placing each type of service in their own set of conduits, wires, armored cable or other wiring methods.

The process of branch circuit wiring comprises the steps of identifying one or more completed circuits in selected service areas, and grouping the completed circuits into one or more home run groups. For each home run group, the process establishes interconnective relationships for the one or more compatible components on each of the groupable completed circuits, determines a home run location of a compatible component of the home run group closest to the associated compatible panel and determines a shortest path of the home run group to the home run location. To produce an engineering drawing having a home run identifier associated with each home run location, the process establishes branch circuit line drawings according to the established interconnective relationships of the one or more compatible components and identifies each drawing lien with a panel identifier and a circuit identifier.

Figure 21:
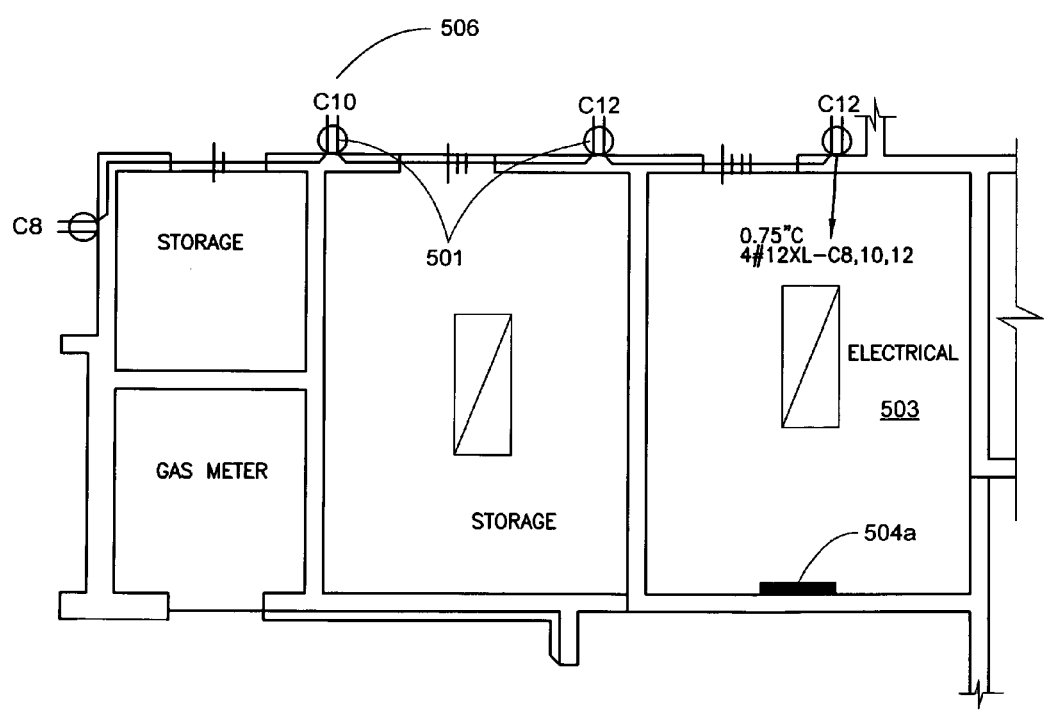
FIG. 21 is a close up of the home run location and home run indicator for depicting circuits 8, 10, and 12, also of panel C and comprising 4 wires, each #12 gauge wire.

As shown in FIG. 21, the home run group identifier can include a home run arrow oriented to the associated panel of the home run group.

Figure 24B:
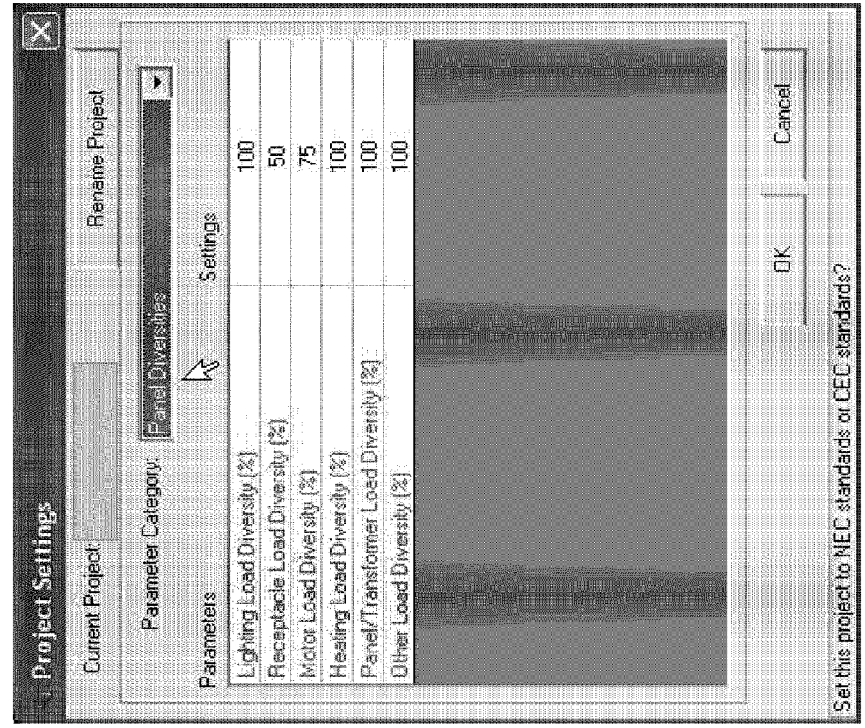
FIG. 24B is an example of an application dialog for illustrating sample parameters for specifying panel diversities.
Figure 24A:
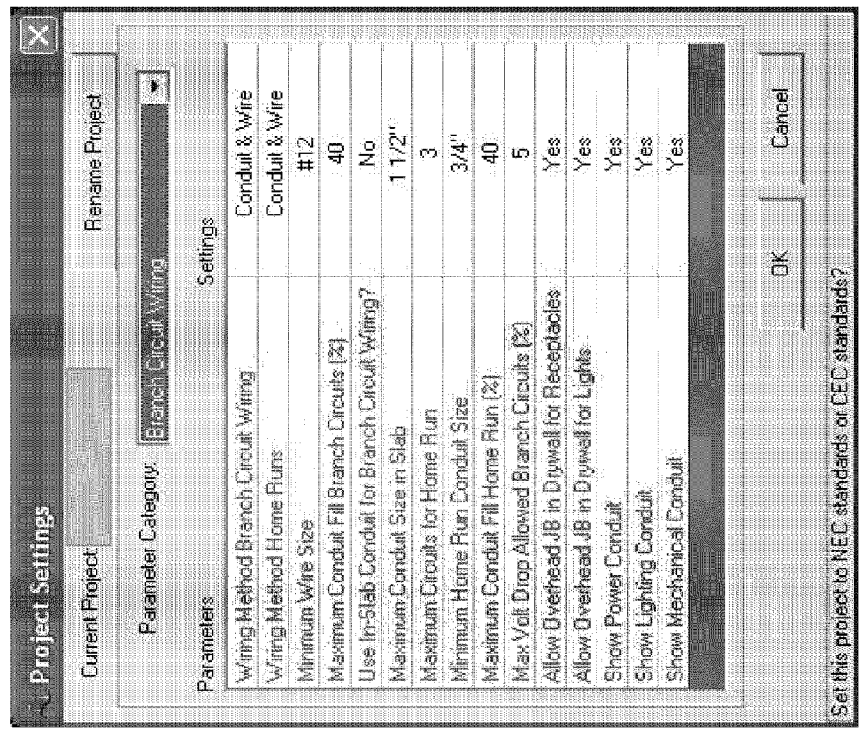
FIG. 24A is an example of an application dialog for illustrating sample parameters for branch circuit wiring.

Referring to FIG. 24A, the end user, using a drop down dialog box, selects a wiring method for the identified circuit created during automated circuiting. Such wiring methods can include armored cable, conduit and wire, and non-metallic dry cable.

The process automatically assigns each of the identified finished circuits to a home run group. A home run group is simply a number of circuits that are grouped together to share a common neutral wire when routed to a shared panel.

Figure 19:
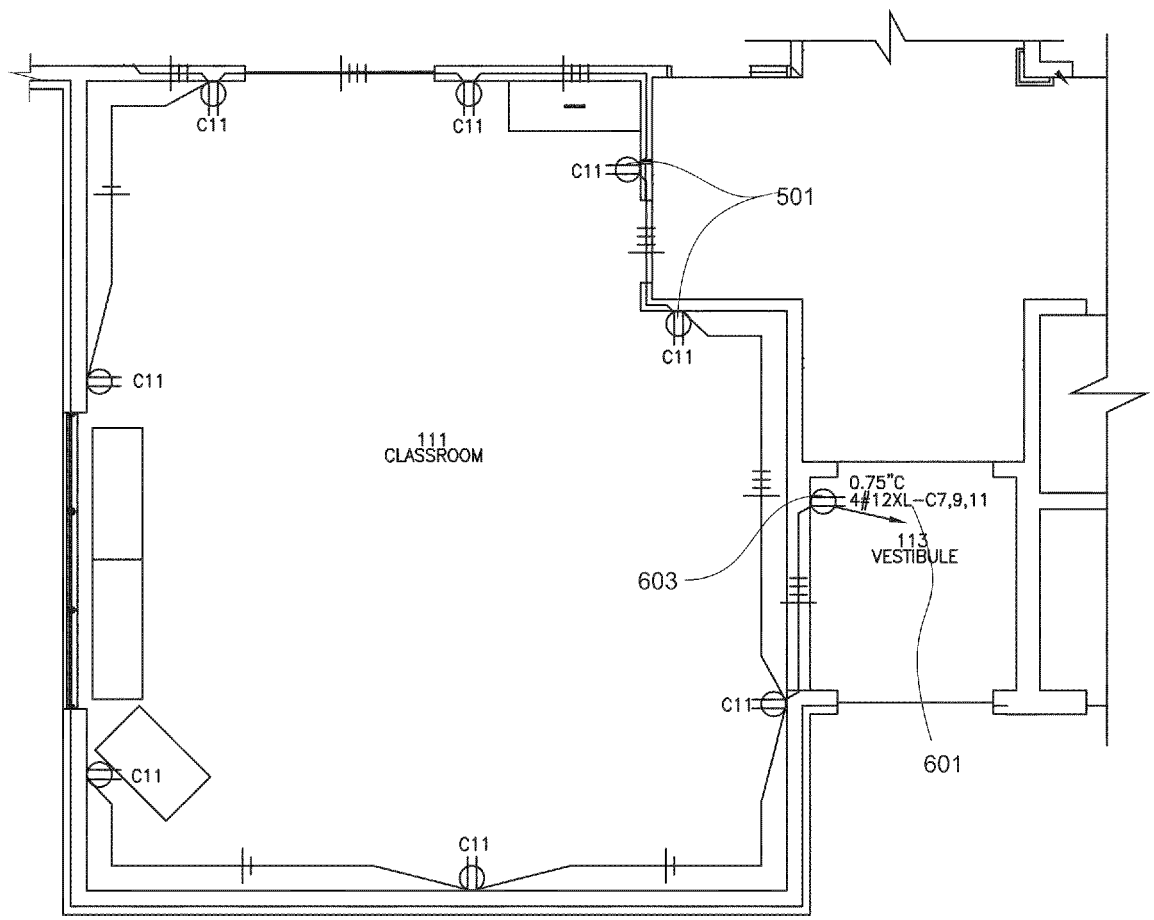
FIG. 19 illustrates the home run grouping for the exemplar classroom of FIG. 7 and neighboring rooms illustrating an embodiment of home run grouping of circuits 7, 9, and 11.
Figure 20:
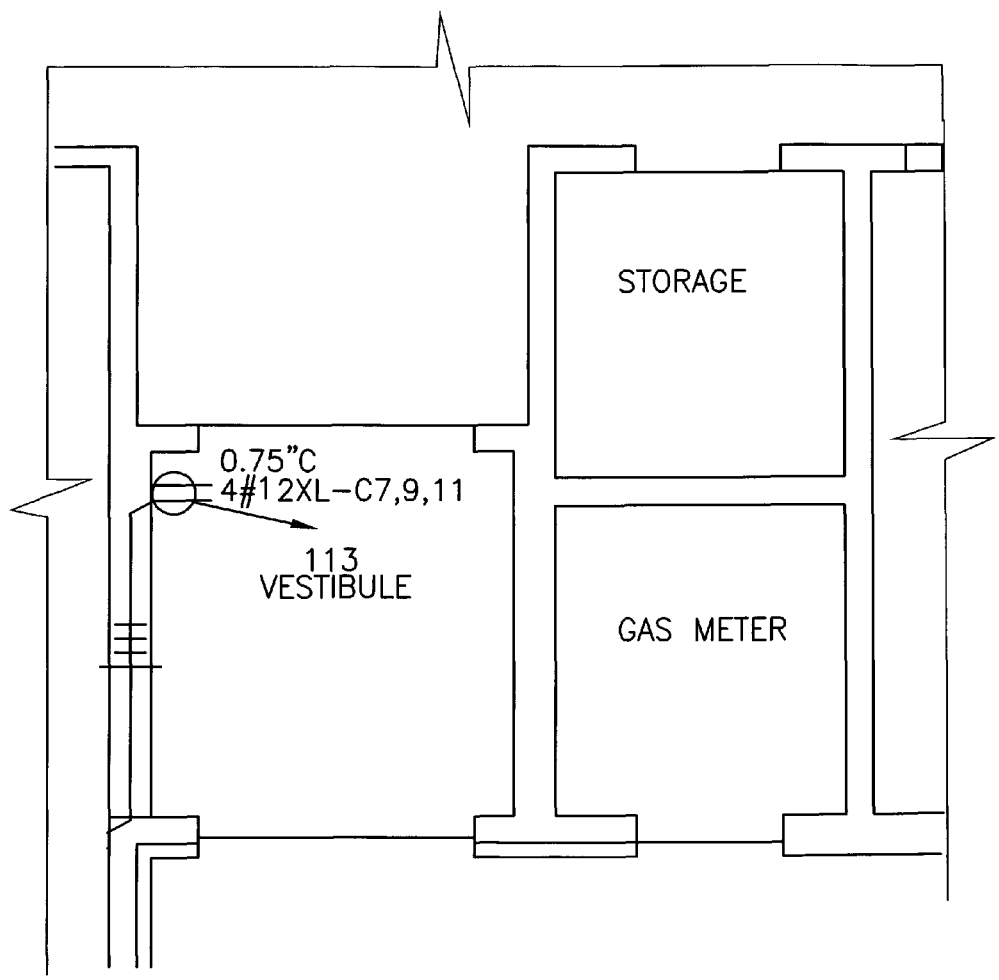
FIG. 20 is a close up of the home run location and home run indicator for depicting circuits 7, 9, and 11, of panel C comprising 4 wires, each #12 gauge wire.

As best shown in FIG. 19, a home run group 601 consists of circuits C7, C9, and C11.

The end user defines the number of circuits that can be included in each home run group. The number of circuits to group together is a client specific parameter based on the personal preference of the client. The client can consider factors such the size of the conduit required for a home run group, the size and costs of conduits commercially available, and the amount of available space remaining in the conduits for new circuits in the future.

Assignment to a particular home run group is determined by many criteria including the length of the circuit, its distance from its specific panel, the possibility of neutral wire sharing, and avoiding looping around panels.

The process attempts to reduce costs for the client by attempting to use the minimum amount of materials required. For example, the process considers the length of each circuit and the distance of that circuit from its specific panel, and determines a shortest route for that circuit to its panel. The route for each circuit is then compared and those circuits having similar routes to the same panel can be grouped together to form a home run group. Shorter routes for the circuits minimize the amount of wiring required and thus the overall costs of construction.

Another criteria for grouping circuits into a home run group is the promotion neutral wire sharing. The process will group those circuits that can share a common neutral wire instead of running separate neutral wiring for each circuit. Circuits that are of different phases can share a common neutral wire.

Referring back to FIGS. 9 and 10, a branch circuit panel schedule for a three phase panel is shown. Each circuit is assigned a particular phase A, B, or C. The panel schedule shows that circuits #1 and #2 are of the same phase A. Circuits #1 and #7 are also of the same phase. Thus, circuits #1, #2, and #7 cannot share the same neutral wire and thus would not be grouped together to form a home run group. If they were grouped together as a home run group, this group would require three separate neutral wires instead of a single neutral wire, unnecessarily increasing costs to the overall project. Accordingly, circuits #1, #3, and #5 can be grouped together to make a home run group, sharing a common neutral wire and reducing overall costs to the client.

As shown in FIG. 19, home run group at 601, circuits C7, C9, and C11 have been grouped together as a home run group. The panel schedule shown on FIG. 9, provides information that circuits C7, C9, and C11 are all of different phases, and thus allowed to be grouped as a home run group.

For each home run group, the process determines a home run location. The home run location is the location of a device in that particular home run group that is closest to its specific panel. An example, as best shown in FIG. 19, the home run location for home run group at 601 is at 603.

Using a sensible path method, such as along the perimeter of a wall, and in a row and column fashion, the process interconnects each of the one or more compatible components within each home run group and then using a shortest room to room method, interconnects the compatible components with the component at its home run location. The route to which the circuit travels to its home run location is optimized to be the shortest route to the home run location while promoting neutral wire sharing. From the home run location, the home run group is connected to its specific panel and each of the circuits is assigned to its corresponding unique location or panel slot.

Herein, shortest routs and paths may be determined using any methodology however, one approach is to use methods of simulated annealing for solving optimization problems of a large scale.

With the routes for the home run groups and each of the individual circuits determined, the process determines the wiring size for each home run group by considering parameters including wire length, wire count, bonding wire size, conduit size and length, and voltage drop. Due to the resistance of wires, thicker wires are required to transmit the same amount of power to an electrical component that is located at the end of a longer transmission wire.

Example

The process of the present invention was applied during the design and construction of a one level school in Canada. With reference FIGS. 5, 6, and 6A to 6D the end user loaded an engineering drawing 500 drawing having at least one electrical building system device and the appropriate module for a school in Canada was selected to be applied to the project.

In preparation for automated circuiting, lighting and receptacles were selected for automated circuiting. The west side of the school was then selected to be circuited and panel room 503 was determined to be the location for all the panels for the services on the west side of the school.

With references to FIGS. 7 and 8A to 8D, with automated circuiting now completed, the receptacles 501 and the lighting components 502 in each room was circuited and assigned to a specific circuit. As shown in FIG. 7, receptacles 501 in classroom 111 were assigned to circuit C11 while the lighting components in classroom 111 were assigned to circuit E4.

FIGS. 9 and 10 show Panel C and Panel E respectively, each showing the various parameters associated with circuits C11 and E4.

Upon completing automated circuiting, the process was ready to proceed with branch circuit wiring, interconnecting all the devices on each finished circuit, grouping finished circuits together into home run groups and drawing routes for the home run groups to their respective home run locations.

Figure 14:
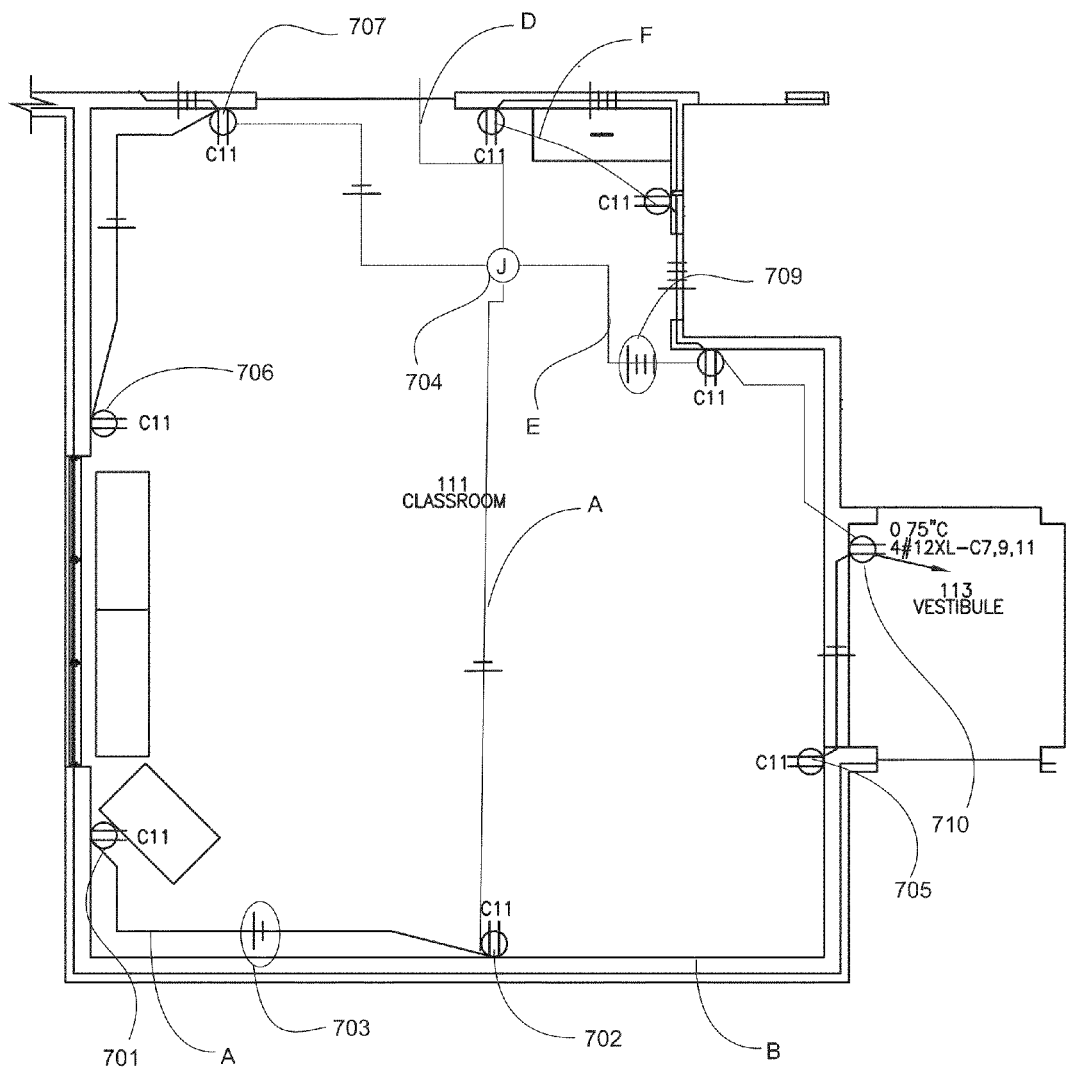
FIG. 14 illustrates the home run grouping for the exemplar classroom of FIG. 7 for just the receptacles, a conduit and wire type of wiring being represented, and circuits 10 and circuit 6 of a neighboring room being in close proximity.
Figure 15:
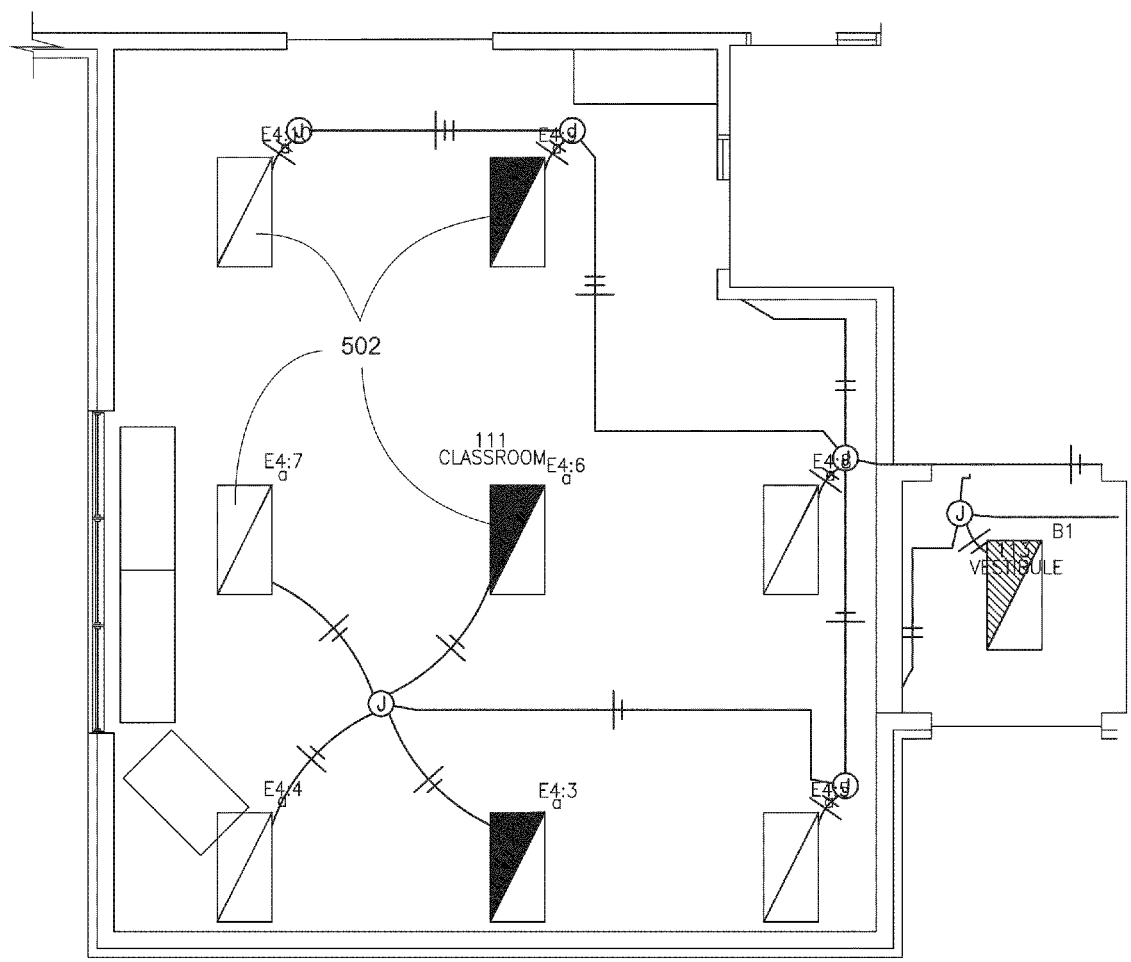
FIG. 15 illustrates the home run grouping for the exemplar classroom of FIG. 7 for just the lighting, a mix of conduit and wire and armored cable type of wiring being represented.

With particular reference to FIG. 14, circuit C11 is shown to be servicing the receptacles of classroom 111. Branch circuit line A of C11 starts at the southwest corner of the classroom at 701 and travels along the wall to a subsequent receptacle at 702. The branch circuit wiring drawing at 703 illustrates that the wiring between receptacle 701 and receptacle 702 along line A comprises a single hot wire and a single neutral wire.

At receptacle 702, C11 branches into two different routes, one route, branch circuit line A continues travelling to a junction at 704 and another route, branch circuit line B travels to receptacle 705. The junction 704 is a location where other branch circuit lines of circuit C11 converge. Branch circuit line C starts at receptacle 706, travelling to receptacle 707 also converges at junction 704. It is at junction 704 where branch circuit line D, servicing a neighboring room (shown in FIGS. 11 and 13) also converges. A total of three different branch circuit lines A, C and D converge at junction 704.

Thus, the branch circuit line E from junction 704 to receptacle 708 is shown to have three hot wires sharing a single neutral wire at 709.

All the branch circuit of lines of circuit C11 (lines B, E, and F) finally combine to join the wiring of circuit C6 at receptacle 710.

With particular reference to FIGS. 12A to 12D, and 15, circuit E4 services the lighting components in classroom 111, while circuit E3 services the lighting in classroom 110 north of classroom 110. Lighting circuits E2 and E5 service the lighting in the portion of the building east of classroom 110 and lighting circuit E4 also services that portion of the building east of classroom 111.

Figure 16:
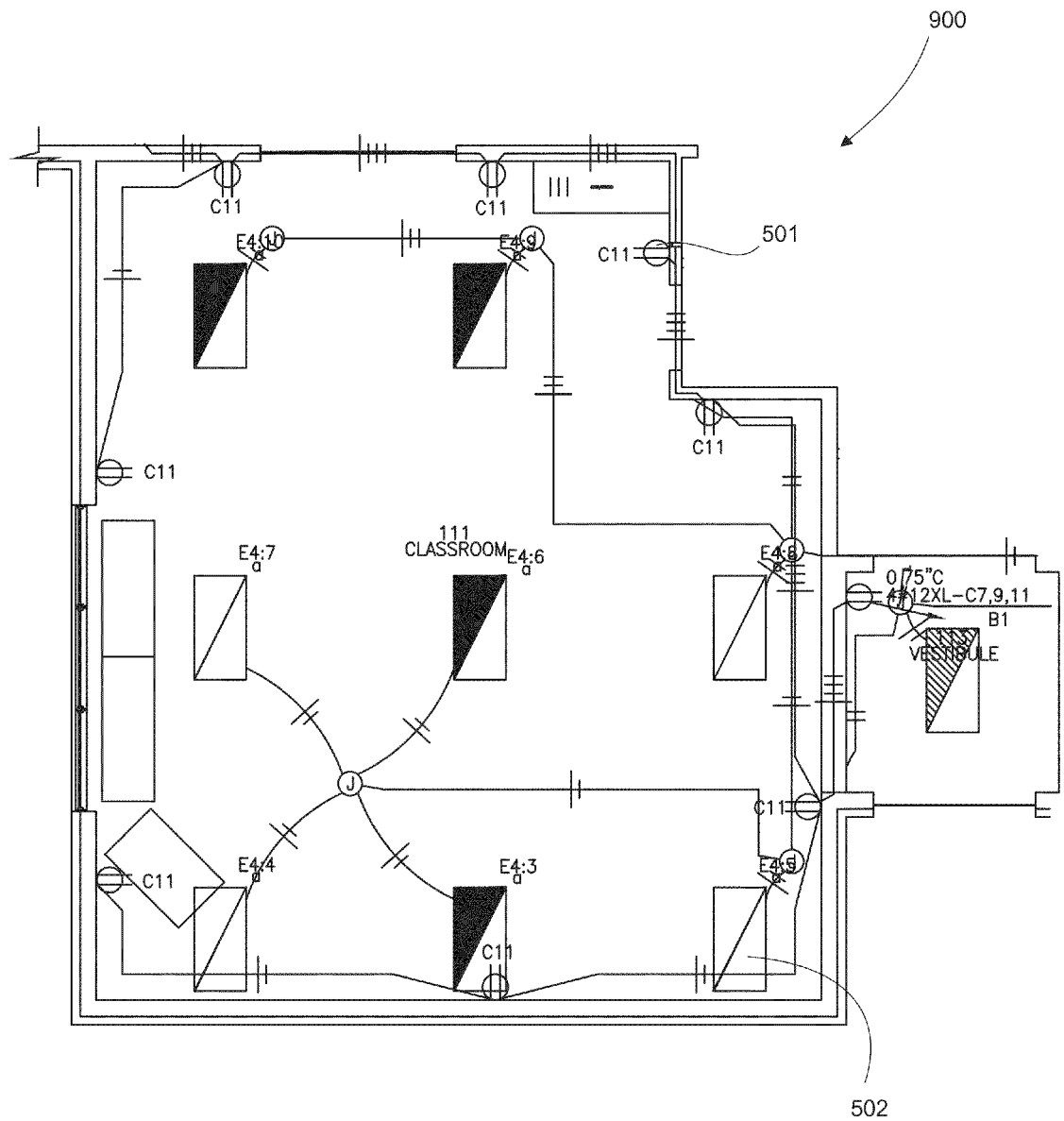
FIG. 16 illustrates the home run grouping for the exemplar classroom of FIG. 7 with both the receptacles and lighting depicted.
Figure 17:
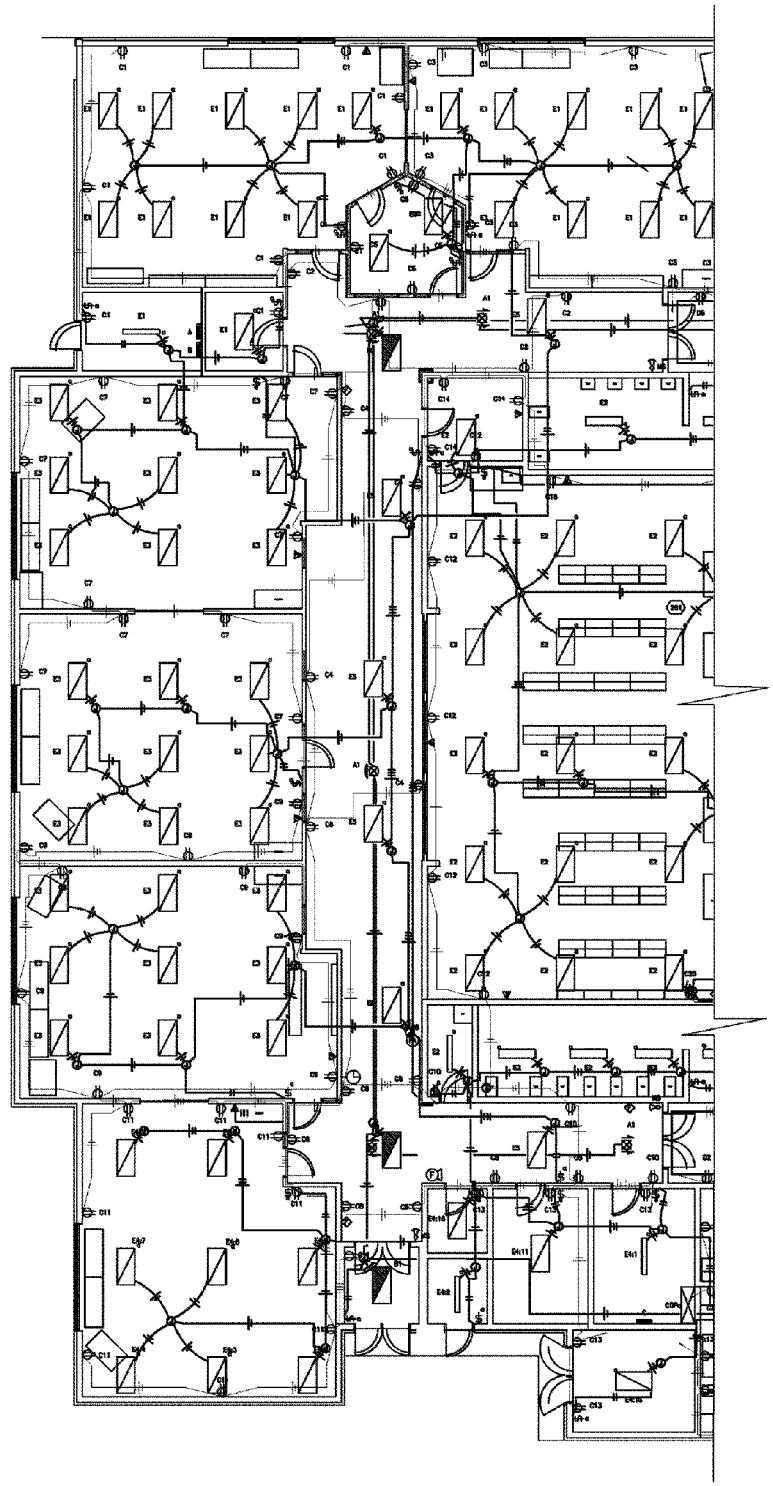
FIG. 17 is the selected area of FIG. 4, wherein an embodiment of the application has been applied for auto-circuiting and branch circuit wiring for the entire selected area.
Figure 18:
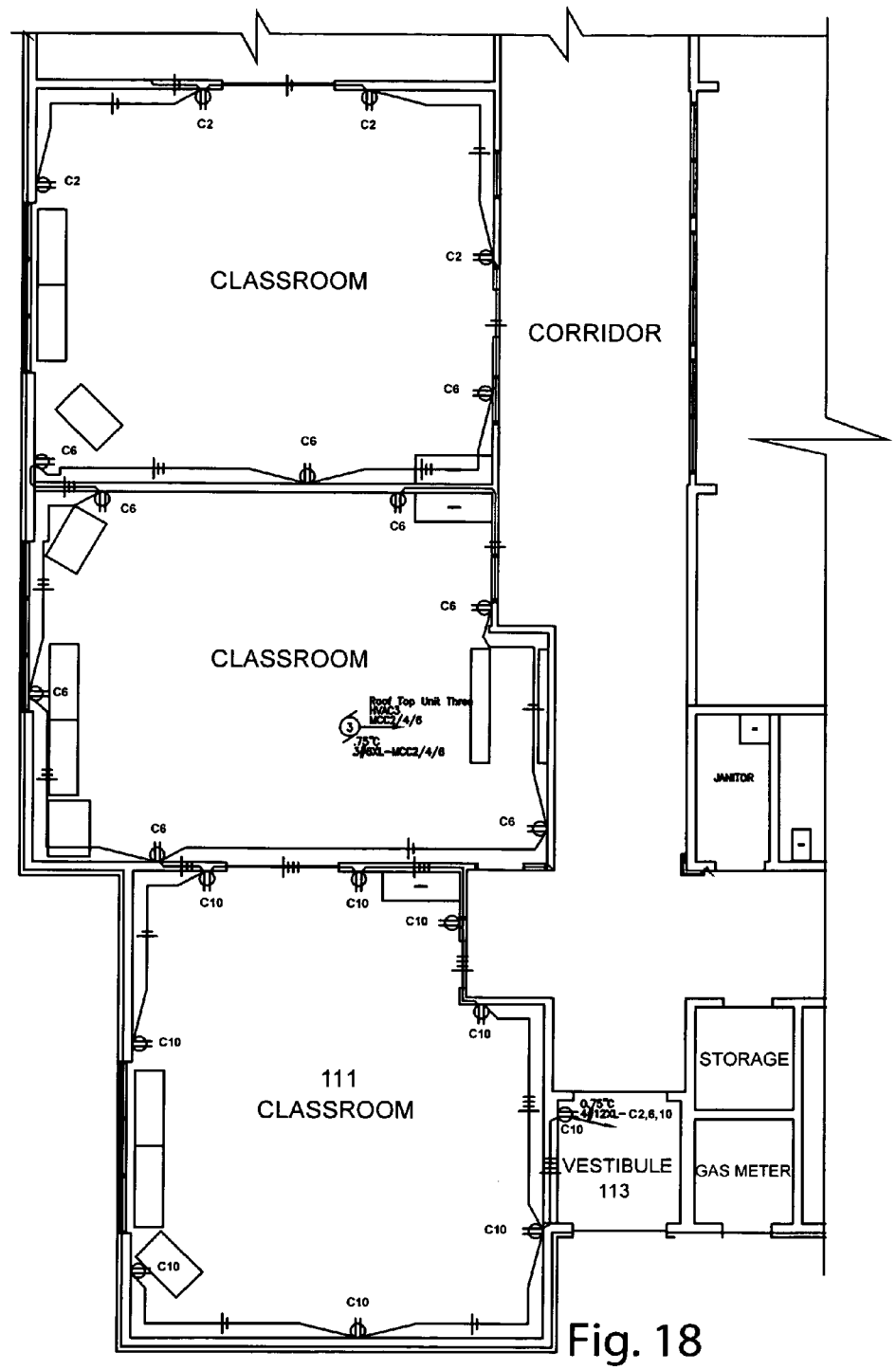
FIG. 18 is the selected area of FIG. 8, illustrating an embodiment of home run grouping of circuits 7, 9, and 11.

As best shown in FIGS. 16 and 17, after branch circuit wiring has been performed on all the services, including receptacles, lighting and mechanical, an engineering drawing 900 illustrating the routes for the various circuits is produced. This drawing 900 can help field installers calculate the amount of wiring needed, the type of wiring needed, as well as an accurate estimate of costs for the wiring needed.

With reference to FIGS. 27 and 28, detailed bills of materials can be generated for more accurate project costs.

Protection and Feeder Specification Determination

Service from power lines is initially brought into a building through a main distribution box. From the main distribution panel, power is transmitted to feeder boxes and then transmitted to branch circuit panels for servicing all the building electrical systems. Protection and feeder box specifications can be calculated as a result of the automated circuiting of all the electrical components, as automated circuited calculates a running total of the load placed on each circuit finished.

To calculate protection and feeder specifications, the process extrapolates and calculates the load beginning from the circuit panels, through the feeder boxes and to the main distribution box. Using the total load, the protection for each component, and in combination with feeder specifications, such as conductors, conduit use and bonding/grounding conductors employed between each component, a schedule having the specifications for the feeders can be produced.

In other words, one can determine protection and feeder specification by calculating load starting from branch circuit panels all the way up through each intermediary service device to utility supply. One selects bus and protection for each service device as required to service calculated load in compliance with electrical engineering industry practice, building electrical codes, and user selected constraints. As required, one can derate in compliance with electrical codes suc has as required for multi-unit dwellings. One selects feeder conductors, conduit, and bonding/grounding conductors between each service device as required to service calculated load in compliance with electrical engineering industry practice, building electrical codes, and user selected constraints. The application then populates attribute data on service devices to reflect calculated values and facilitate completely automated generation of schedules related to service device protection and feeders.

Fault Level Determination

Figures 25A, 25B:
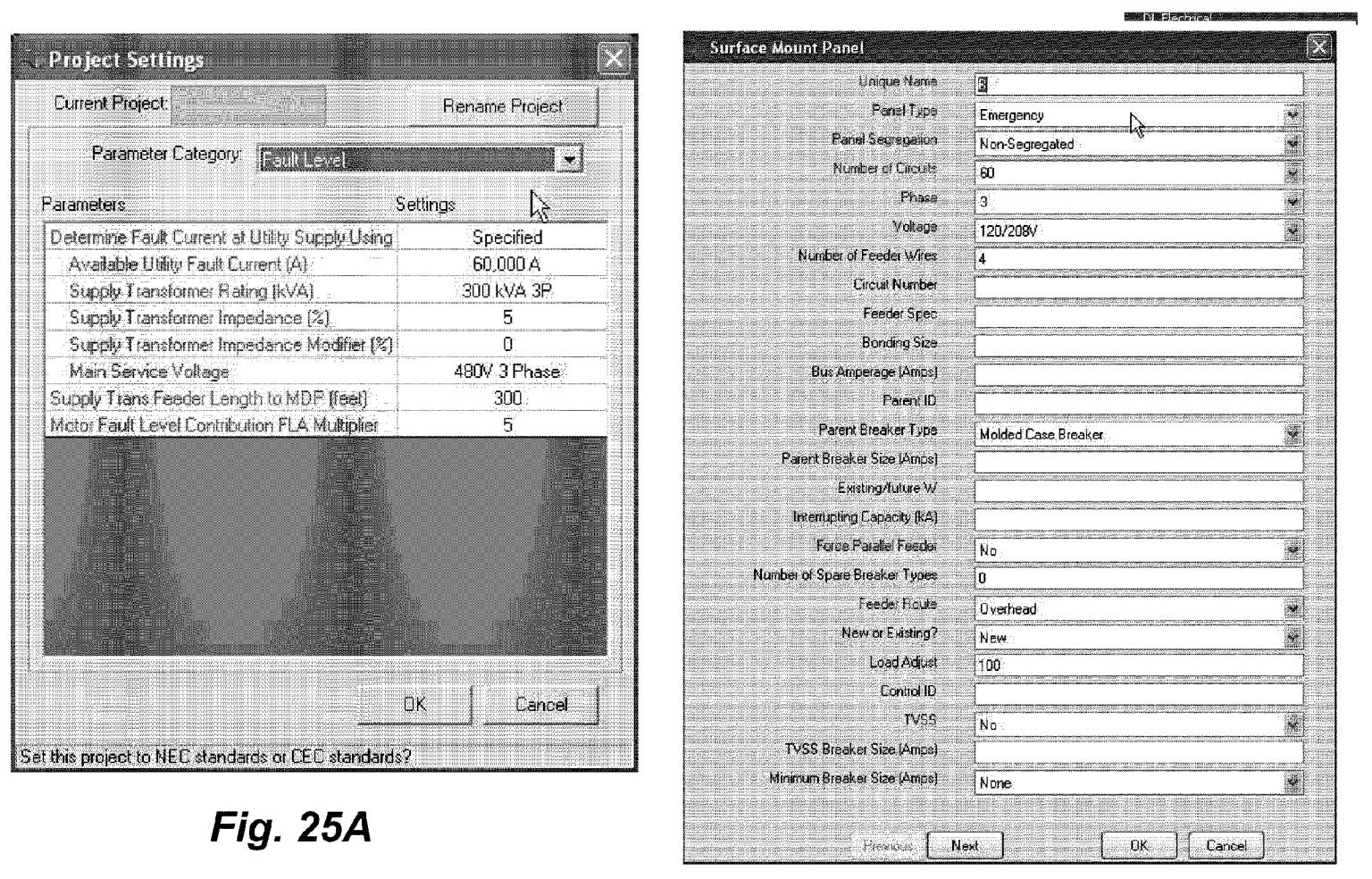

With reference to FIG. 25A, fault levels at each component can be calculated using feeder composition, feeder length (calculated distance between each component), calculated motor fault contribution and utility supply fault level (or estimated utility supply fault level). One can calculate distance between service devices, determine where motors occur in the project and how they will contribute to fault levels to electrical service providing devices connected between the motors and the utility supply, load user specified utility supply fault levels information, calculate estimated utility supply fault level if user unable to supply and use feeder composition, feeder length, calculated motor fault contribution, and utility supply fault level to calculate fault level at each service device in the project. One can populate attribute data on service devices to reflect fault levels and facilitate completely automated generation of schedules related to fault levels.

The embodiments of the invention for which an exclusive property or privilege is claimed are defined as follows:

1. A computer-implemented process for the production of electrical engineering drawings from a computer-aided drafting (CAD) drawing having electrical components positioned therein comprising:

implementing a computer aided design application;

loading the CAD drawing, the CAD drawing having at least one space having one or more of the electrical components therein;

identifying a service area from the CAD drawing, the service area having at least one electrical component therein;

creating, with the application, two or more unassigned circuits, each unassigned circuit being associated with a compatible type of component of the electrical components, each unassigned circuit begin created by:

identifying a compatible component in the at least one space, populating the unassigned circuit with the compatible component and includes phase grouping circuits to adjacent slots on a panel, wherein populating the unassigned circuit further includes calculating a maximum circuit limit for each of the two or more created unassigned circuits, determining a location for each of the created unassigned circuit based a circuit having routes of close proximity of a one or more circuit matching a specific service type and voltage criteria, and determining a placement for each of a plurality of compatible components in accordance with the calculated maximum circuit limit, the matched specific service type and voltage criteria;

determining if the unassigned circuit is finished, wherein determining if the unassigned circuit is finished comprises: tracking at least one parameter, the parameter related to the determination if the unassigned circuit is finished, the one or more parameters being selected from the group consisting of an electrical code, specifications of the electrical components, or user-determined parameters; and comparing the at least one tracked parameter to a pre-determined circuit condition;

repeating the identifying of a subsequent compatible component and populating the unassigned circuit with the subsequent compatible components until the unassigned circuit is finished, and repeating creating finished, unassigned circuits for each of the two or more unassigned circuits;

determining a shortest route for each finished, unassigned circuit;

reorganizing finished, unassigned circuits for gathering finished, unassigned circuits having routes of close proximity;

associating each finished, unassigned circuit with a panel having a unique panel identifier, the panel for gathered unassigned circuits being a common panel;

establishing a completed circuit by assigning, to each finished, unassigned finished circuit, a circuit identifier and the panel identifier for the panel associated therewith; and producing an electrical engineering drawing having each component identified by its panel identifier and circuit identifier.

2. The process of claim 1 wherein the determining of a shortest route for each finished unassigned circuit is without circuit crossovers.

3. The process of claim 1 wherein the associating of gathered unassigned circuits to a common panel further comprise phase grouping gathered circuits.

4. The process of claim 2 wherein the establishing of a completed circuit further comprises assigning a panel slot.

5. The process of claim 1 wherein determining if the unassigned circuit is finished comprises exhausting the identifying of subsequent compatible components in the at least one space.

6. The process of claim 1 wherein determining if the unassigned circuit is finished comprises:
tracking at least one parameter, the parameter related to the determination if the unassigned circuit is finished, the one or more parameters being selected from the group consisting of an electrical code, specifications of the electrical components, or user-determined parameters; and
comparing the at least one tracked parameter to a pre-determined circuit condition.

7. The process of claim 6 wherein the at least one parameter is electrical load and the pre-determined circuit condition is a pre-determined maximum circuit limit.

8. The process of claim 1 wherein the identifying of a service area comprises selecting an area of the CAD drawing including a finite number of the one or more spaces.

9. The process of claim 1 wherein the identifying of a service area comprises selecting all of the one or more spaces and wherein the application associates one or more of the spaces as a panel room.

10. The process of claim 1 wherein the establishing one or more unassigned circuits for one or more types of components comprises establishing an unassigned circuit for one or more types of compatible components of a building electrical system.

11. The process of claim 10 wherein the establishing of one or more unassigned circuits for one or more types of components comprises establishing an unassigned circuit for one or more types of compatible components selected from the group consisting of receptacles, lighting, heaters and mechanical equipment.

12. The process of claim 1 wherein after exhausting the subsequent compatible components in the at least one space, further comprising:
locating a neighboring space of the at least one space;
qualifying the neighboring room; and
repeating identifying a subsequent compatible component and populating the unassigned circuit and finishing closing the circuit.

13. The process of claim 12 wherein the qualifying of a neighboring room comprises establishing that the unassigned circuit of the previous space can accept the entirety of the subsequent compatible components of the neighboring space.

14. The process of claim 13 wherein the qualifying of a neighboring room further comprising determining if a running total of component loads does not exceed a maximum circuit limit.

15. The process of claim 1 wherein an unassigned circuit is populated sequentially with wall-mounted components along a wall of the space or with ceiling-mounted components in rows and columns of a ceiling.

16. The process of claim 1 wherein each completed circuit is associated with one of an available panel slots of the completed circuit's associated panel.

17. The process of claim 16 wherein the producing of the electrical engineering drawing further comprises producing a circuit panel schedule.

18. The process of claim 1 further comprising:
determining a total load for each of a plurality of service devices including all associated panels, a main distribution panel and through to a utility supply; and
selecting electrical bus and protection for each service device;
selecting all conductors and conduit between each service device; and
generating service device protection and feeder schedules.

19. The process of claim 18 further comprising:
determining distance between service devices and calculating fault levels and generate fault level schedules.

20. The process of claim 1 further comprising:
determining the voltage of the compatible components of the circuit;
locating a compatible panel for the voltage in the associated panel room; and
adding circuit to the located compatible panel.

21. The process of claim 20 wherein when no compatible panel is located in the associated panel room, further comprising creating a new compatible panel in the associated panel room.

22. The process of claim 1 wherein the assigning of a panel identifier to each completed circuit further comprises assigning completed circuits for like compatible components to adjacent areas of the associated panel.

23. The process of claim 22 wherein the assigning completed circuits for like compatible components to adjacent areas of the associated panel further comprises assigning an available panel slot in an adjacent area having different phase to promote neutral wire sharing.

24. The process of claim 1 further comprising:
identifying one or more completed circuits in the selected area;
grouping completed circuits into one or more home run groups;
and for each home run group,
establishing the interconnection relationship of the one or more compatible components on each of the groupable completed circuits;
determining a home run location of a compatible component of the home run group closest to the associated compatible panel; and
determining a shortest path of the home run group to the home run location;
establishing branch circuit line drawing elements according to the established interconnection relationship of the one or more compatible components and along the shortest path;
assigning a home run identifier to each home run location; and
producing an electrical engineering drawing wherein
each component is interconnected with the branch circuit line drawing elements and identified by its panel identifier and circuit identifier, and
each home run group is identified its home run identifier.

25. The process of claim 24 wherein the home run identifier includes a home run arrow oriented to the associated panel.

26. The process of claim 24 wherein the establishing of branch circuit line drawing elements further comprises using line drawing elements in compliance with standard practice for various wiring mediums.

27. The process of claim 26 wherein branch circuit line drawing elements include indicators of the number of hot wires and neutral wires grouped in the home run group.

28. The process of claim 24 further comprising:
performing a wire count, and for each wire counted determining at least a wire length and a wire size.

29. The process of claim 28 wherein, the determining of the wire size further comprises determining a voltage drop for the wire length and adjusting the wire size to meet or exceed the largest wire size according to a breaker rating associated with the completed circuit, a user-specified minimum wire size or so as to achieve a specified maximum voltage drop.

30. The process of claim 24 further comprising:
performing a wire count and, for each wire counted, determining at least a wire length and a wire size;
for each home run group, determining a number of hot wires and neutral wires; and
assigning at least a wire count, a wire size, and a circuit identifier for each home run group.

31. A computer-implemented process for the production of electrical engineering drawings from a computer-aided drafting (CAD) drawing comprising:
implementing a computer aided design application;
loading the CAD drawing, the CAD drawing having at least one space having one or more completed circuits therein, each completed circuit being populated with one or more compatible components, wherein populating the completed circuit includes calculating a maximum circuit limit for each of the one or more completed circuits;
grouping completed circuits into one or more home run groups, wherein the grouping includes phase grouping the completed circuits to adjacent slots on a panel in accordance with the calculated maximum circuit limit;
creating, with the application, two or more unassigned circuits, each unassigned circuit being associated with a compatible type of component of the electrical components, each unassigned circuit begin created by: identifying a compatible component in the at least one space, populating the unassigned circuit with the compatible component;
determining if the unassigned circuit is finished, wherein determining if the unassigned circuit is finished comprises: tracking at least one parameter, the parameter related to the determination if the unassigned circuit is finished, the one or more parameters being selected from the group consisting of an electrical code, specifications of the electrical components, or user-determined parameters; and comparing the at least one tracked parameter to a pre-determined circuit condition;
for each home run group, establishing an interconnection relationship of the one or more compatible components on each of the grouped completed circuits, based on a circuit having routes of close proximity of one or more circuits matching a specific service type and voltage criteria, and determining a placement for each of the one or more compatible components in accordance with the calculated maximum circuit limit, the matched specific service type and voltage criteria;
determining a home run location of a compatible component of the home run group closest to the associated compatible panel;
determining a shortest path of the home run group to the home run location;
establishing branch circuit line drawing elements according to the established interconnection relationship of the one or more compatible components and along the shortest path;
assigning a home run identifier to each home run location; and
producing an electrical engineering drawing wherein each compatible component is interconnected with the branch circuit line drawing elements and identified by its panel identifier and circuit identifier, and each home run group is identified its home run identifier.

* * * * *